(12) United States Patent
Sutardja

(10) Patent No.: US 7,863,657 B2
(45) Date of Patent: Jan. 4, 2011

(54) EFFICIENT TRANSISTOR STRUCTURE

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 606 days.

(21) Appl. No.: 11/586,470

(22) Filed: Oct. 25, 2006

(65) Prior Publication Data

US 2007/0037353 A1    Feb. 15, 2007

Related U.S. Application Data

(63) Continuation of application No. 11/524,113, filed on Sep. 20, 2006, which is a continuation-in-part of application No. 11/252,010, filed on Oct. 17, 2005, now Pat. No. 7,164,176, which is a continuation of application No. 10/691,237, filed on Oct. 22, 2003, now Pat. No. 7,091,565.

(60) Provisional application No. 60/825,517, filed on Sep. 13, 2006, provisional application No. 60/824,357, filed on Sep. 1, 2006, provisional application No. 60/823,332, filed on Aug. 23, 2006, provisional application No. 60/821,008, filed on Aug. 1, 2006, provisional application No. 60/798,568, filed on May 8, 2006.

(51) Int. Cl.
*H01L 29/72* (2006.01)
(52) U.S. Cl. ................. 257/266; 257/288; 257/341; 257/342; 257/401
(58) Field of Classification Search ............... 257/266, 257/288, 341, 342, 401
See application file for complete search history.

(56) References Cited

U.S. PATENT DOCUMENTS

| 4,409,499 | A | 10/1983 | Zapisek et al. |
| 4,639,754 | A | 1/1987 | Wheatley, Jr. et al. |
| 5,323,036 | A | 6/1994 | Neilson et al. |
| 5,793,068 | A | 8/1998 | Mahant-Shetti |
| 5,838,050 | A | 11/1998 | Ker et al. |

(Continued)

FOREIGN PATENT DOCUMENTS

EP    0841702 A    5/1998

(Continued)

OTHER PUBLICATIONS

Organized Translation of Decision of Rejection from the Japanese Patent Office dated Oct. 16, 2007 for Application No. 2004-238034; 10 pages.

(Continued)

*Primary Examiner*—Edward Wojciechowicz

(57) ABSTRACT

An integrated circuit comprises a first drain region having a symmetric shape across at least one of horizontal and vertical centerlines. A first gate region has a first shape that surrounds the first drain region. A second drain region has the symmetric shape. A second gate region has the first shape that surrounds the second drain region. A connecting gate region connects the first and second gate regions. A first source region is arranged adjacent to and on one side of the first gate region, the second gate region and the connecting gate region. A second source region is arranged adjacent to and on one side of side of the first gate region, the second gate region and the connecting gate region.

15 Claims, 20 Drawing Sheets

U.S. PATENT DOCUMENTS

| | | | |
|---|---|---|---|
| 5,866,931 A | 2/1999 | Bulucea et al. | |
| 6,051,884 A | 4/2000 | Papadas | |
| 6,054,728 A | 4/2000 | Harada et al. | |
| 6,100,591 A | 8/2000 | Ishii | |
| 6,178,082 B1 | 1/2001 | Farooq et al. | |
| 6,204,533 B1 | 3/2001 | Williams et al. | |
| 6,264,167 B1 | 7/2001 | Hamazawa | |
| 6,278,264 B1 | 8/2001 | Burstein et al. | |
| 6,281,549 B1 | 8/2001 | Davies | |
| 6,448,510 B1 | 9/2002 | Neftin et al. | |
| 6,477,034 B1 | 11/2002 | Chakravorty et al. | |
| 6,486,557 B1 | 11/2002 | Davis et al. | |
| 6,489,689 B2 | 12/2002 | Nojiri | |
| 6,566,710 B1 | 5/2003 | Strachan et al. | |
| 6,686,300 B2 | 2/2004 | Mehrotra et al. | |
| 6,724,044 B2 | 4/2004 | Blanchard | 257/341 |
| 6,740,930 B2 | 5/2004 | Mattei et al. | |
| 6,744,288 B1 | 6/2004 | Doyle et al. | |
| 6,867,083 B2 | 3/2005 | Imam et al. | |
| 7,075,147 B2 | 7/2006 | Cao | |
| 7,371,627 B1 * | 5/2008 | Forbes | 438/197 |
| 7,528,444 B2 | 5/2009 | Sutardja | |
| 2001/0045670 A1 | 11/2001 | Nojiri | |
| 2002/0076851 A1 | 6/2002 | Eden et al. | |
| 2002/0153609 A1 | 10/2002 | Kaneko et al. | |
| 2003/0006467 A1 | 1/2003 | Mattei et al. | |
| 2003/0209759 A1 | 11/2003 | Blanchard | |
| 2005/0110056 A1 | 5/2005 | Sutardja | |
| 2005/0231990 A1 | 10/2005 | Uno et al. | |
| 2006/0033171 A1 | 2/2006 | Sutardja | |
| 2007/0034903 A1 | 2/2007 | Sutardja | |
| 2007/0210430 A1 | 9/2007 | Kagii et al. | |
| 2008/0157209 A1 | 7/2008 | Sutardja | |

FOREIGN PATENT DOCUMENTS

| | | | |
|---|---|---|---|
| EP | 0 867 929 A2 | | 9/1998 |
| EP | 0 982 777 | * | 1/2000 |
| EP | 0982777 | | 3/2000 |
| EP | 1 107 313 A2 | | 6/2001 |
| EP | 1256985 A | | 11/2002 |
| EP | 1267413 A2 | | 12/2002 |
| EP | 1420450 | | 5/2004 |
| EP | 1526576 | | 4/2005 |
| EP | 1548831 | | 6/2005 |
| EP | 1 727 200 | | 11/2006 |
| JP | 60076160 A | | 4/1985 |
| JP | 01207976 | | 8/1989 |
| JP | 08 046198 | | 2/1996 |
| JP | 10-233508 | | 9/1998 |
| JP | 11214529 | | 8/1999 |
| JP | 2000-208759 | | 7/2000 |
| JP | 2002-368121 | | 12/2002 |
| JP | 2004-260026 | | 9/2004 |
| WO | WO 98/53499 A1 | | 11/1998 |
| WO | WO 00/31797 A2 | | 6/2000 |
| WO | WO 00/31797 A3 | | 6/2000 |

OTHER PUBLICATIONS

EPO Communication and Search Report date Oct. 12, 2007 for European Patent Application No. 04 012 376.2, 7 pgs.

Notification of Transmittal of The International Search Report and The Written Opinion of The International Searching Authority, or The Declaration dated May 16, 2007 in reference to PCT/US2007/011207 (17 pgs).

Communication from the European Patent Office dated Nov. 14, 2006 with the extended European Search Report for Application No. 06011395.8-2203, 7 pages.

Communication from the European Patent Office dated Nov. 14, 2006 with the extended European Search Report for Application No. 06011396.6-2203, 6 pages.

Communication from the European Patent Office dated Feb. 22, 2006 with the European Search Report for Application No. 050002849-2203.

Communication Relating to the Results of the Partial International Search dated Jun. 26, 2009 for application PCT/US2008/003491, 5 pgs.

EPO Communication and Search Report dated Feb. 6, 2006 for European Patent Application No. 05 000 284.9, 4 pgs.

Official Communication from the European Patent Office dated Sep. 13, 2007 for Application No. 06 011 395.8-2203; 4 pages.

Official Communication from the European Patent Office dated Sep. 13, 2007 for Application No. 06 011 396.6-223; 3 pages.

Organized Translation of Notice of Reasons for Rejection from the Japanese Patent Office dated Aug. 28, 2007 for Japanese Patent Application 2005-006181; 18 pages.

Notification of Transmittal of the International Search Report and the Written Opinion of The International Searching Authority, or The Declaration dated Aug. 24, 2009 for application PCT/US2008/003491, 19 pgs.

First Office Action from the Japanese Patent Office dated Mar. 10, 2010 for Application No. 2007-80025919.4; 9 pages.

* cited by examiner

EFFICIENT TRANSISTOR STRUCTURE

CROSS-REFERENCE TO RELATED APPLICATIONS

This application is a Continuation of U.S. patent application Ser. No. 11/524,113 filed Sep. 20, 2006, which application claims the benefit of U.S. Provisional Application Nos. 60/825,517, filed Sep. 13, 2006, 60/824,357, filed Sep. 1, 2006, 60/823,332, filed on Aug. 23, 2006, 60/821,008, filed Aug. 1, 2006 and 60/798,568, filed on May 8, 2006 and is a continuation-in-part of U.S. patent application Ser. No. 11/252,010 filed on Oct. 17, 2005, which is a continuation of U.S. patent application Ser. No. 10/691,237 filed on Oct. 22, 2003. The disclosure of the above application is incorporated herein by reference in its entirety.

FIELD OF THE INVENTION

The present invention relates to transistor structures, and more particularly to transistor structures with reduced chip area.

BACKGROUND OF THE INVENTION

Integrated circuits or chips may include a large number of interconnected transistors. The transistors and other circuit elements are interconnected in various ways to provide desired circuit functions. It is usually most efficient to fabricate multiple integrated circuits on a single wafer. After processing, the integrated circuits that are fabricated on the wafer are separated and then packaged. The wafer can accommodate a fixed number of integrated circuits for a given integrated circuit size. Reducing the size of individual transistors in the integrated circuit may help to reduce the overall size of the integrated circuit. This, in turn, allows an increased number of integrated circuits or chips to be made on each wafer and reduces the cost of the integrated circuits.

Referring now to FIGS. 1 and 2, an exemplary transistor 10 includes a drain 12, a gate 14, a source 16 and a body 18 or substrate tap. For example, the transistor 10 in FIG. 1 is an NMOS transistor. In some circumstances, the body 18 is connected to the source 16 as shown in FIG. 2.

Referring now to FIG. 3, the body 18 includes a p+ region and may include a contact tap 30. The source 16 includes an n+ region and may include a contact tap 32. The drain 12 includes an n+ region and may include a contact tap 34. Additional transistors may be fabricated on one or sides of the transistor 10 as indicated by " . . . " in FIG. 3.

Referring now to FIG. 4, the body 18 may be repeated between sources 16 of adjacent transistors. The body 18 takes up valuable chip area and increases the size of the transistor and the integrated circuit. Additional transistors can be arranged on one or more sides of the transistor 10 as shown by " . . . " in FIG. 4.

SUMMARY OF THE INVENTION

An integrated circuit comprises a first source, a first drain, a second source, a first gate arranged between the first source and the first drain, and a second gate arranged between the first drain and the second source. The first and second gates define alternating first and second regions in the drain. The first and second gates are arranged farther apart in the first regions than in the second regions.

In other features, a well substrate contact is arranged in the first regions. Alternatively, R well substrate contacts are arranged in the first regions, where R is an integer greater than one. R is an integer that is greater than three and less than seven. The integrated circuit includes a plurality of transistors. The transistors include PMOS transistors. The R well substrate contacts are associated with respective ones of R transistors.

In other features, the integrated circuit comprises a second drain; and a third gate arranged between the second source and the second drain. The second and third gates define alternating third and fourth regions. The second and third gates are arranged farther apart in the third regions than in the fourth regions.

In yet other features, the first regions are arranged adjacent to the fourth regions and the second regions are arranged adjacent to the third regions. The first and third regions include R well substrate contacts.

A method for providing an integrated circuit comprises providing a first source; providing a first drain; providing a second source; locating a first gate between the first source and the first drain; locating a second gate between the first drain and the second source; defining alternating first and second regions in the drain using the first and second gates; and arranging the first and second gates farther apart in the first regions as compared to the second regions.

In other features, the method includes locating a well substrate contact in the first regions. The method includes locating R well substrate contacts in the first regions, where R is an integer greater than one. R is an integer that is greater than three and less than seven. The integrated circuit includes a plurality of transistors. The transistors include PMOS transistors. The method includes associating the R well substrate contacts with respective ones of R transistors.

In other features, the method includes providing a second drain; providing a third gate between the second source and the second drain; defining alternating third and fourth regions using the second and third gates; and arranging the second and third gates are arranged farther apart in the third regions than in the fourth regions.

In other features, the method includes arranging the first regions adjacent to the fourth regions and the second regions adjacent to the third regions. The first and third regions include R well substrate contacts, where R is an integer greater than one.

An integrated circuit comprises a first drain region having a generally rectangular shape. First, second, third and fourth source regions have a generally rectangular shape and are arranged adjacent to sides of the first drain region. A gate region is arranged between the first, second, third and fourth source regions and the first drain region. First, second, third and fourth substrate contact regions are arranged adjacent to corners of the first drain region.

In other features, the first, second, third and fourth source regions have a length that is substantially equal to a length of the drain region. The first, second, third and fourth source regions have a width that is less than a width of the first drain region. The width of the first, second, third and fourth source regions is approximately one-half the width of the first drain region.

In other features, a second drain region has a generally rectangular shape and has one side that is arranged adjacent to the first source region. Fifth, sixth and seventh source regions have a generally rectangular shape. The fifth, sixth and seventh source regions are arranged adjacent to other sides of the second drain region.

In other features, a gate region is arranged between the first, fifth, sixth and seventh source regions and the second drain region. Fifth and sixth substrate contact regions are arranged adjacent to corners of the second drain region. The integrated circuit includes laterally-diffused MOSFET transistors.

A method for providing an integrated circuit comprises providing a first drain region having a generally rectangular shape; arranging sides of first, second, third and fourth source regions, which have a generally rectangular shape, adjacent to sides of the first drain region; arranging a gate region between the first, second, third and fourth source regions and the first drain region; and arranging first, second, third and fourth substrate contact regions adjacent to corners of the first drain region.

In other features, the first, second, third and fourth source regions have a length that is substantially equal to a length of the drain region. The first, second, third and fourth source regions have a width that is less than a width of the first drain region. The width of the first, second, third and fourth source regions is approximately one-half the width of the first drain region.

In other features, the method includes arranging one side of a second drain region, which has a generally rectangular shape, adjacent to the first source region; and arranging fifth, sixth and seventh source regions, which have a generally rectangular shape, adjacent to other sides of the second drain region. The method includes arranging a gate region between the first, fifth, sixth and seventh source regions and the second drain region. The method includes arranging fifth and sixth substrate contact regions adjacent to corners of the second drain region. The integrated circuit includes laterally-diffused MOSFET transistors.

An integrated circuit comprises a first drain region having a symmetric shape across at least one of horizontal and vertical centerlines. A first gate region has a first shape that surrounds the first drain region. A second drain region has the symmetric shape. A second gate region has the first shape that surrounds the second drain region. A connecting gate region connects the first and second gate regions. A first source region is arranged adjacent to and on one side of the first gate region, the second gate region and the connecting gate region. A second source region is arranged adjacent to and on one side of side of the first gate region, the second gate region and the connecting gate region.

In other features, the symmetric shape tapers as a distance from a center of the symmetric shape increases. First and second substrate contacts are arranged in the first and second source regions. The integrated circuit includes laterally-diffused MOSFET transistors.

In other features, the symmetric shape is a circular shape. The symmetric shape is an elliptical shape. The symmetric shape is a polygonal shape. The symmetric shape is a hexagonal shape.

A method for providing an integrated circuit comprises providing a first drain region having a symmetric shape across at least one of horizontal and vertical centerlines; providing a first gate region having a first shape that surrounds the first drain region; providing a second drain region having the symmetric shape; providing a second gate region having the first shape that surrounds the second drain region; connecting a connecting gate region to the first and second gate regions; arranging a first source region adjacent to and on one side of the first gate region, the second gate region and the connecting gate region; and arranging a second source region adjacent to and on one side of side of the first gate region, the second gate region and the connecting gate region.

In other features, the symmetric shape tapers as a distance from a center of the symmetric shape increases. In other features, the method includes arranging first and second substrate contacts in the first and second source regions. The integrated circuit includes laterally-diffused MOSFET transistors.

In other features, the symmetric shape is a circular shape. The symmetric shape is an elliptical shape. The symmetric shape is a polygonal shape. The symmetric shape is a hexagonal shape.

An integrated circuit comprises first and second drain regions having a generally rectangular shape. First, second and third source regions that have a generally rectangular shape, wherein the first source region is arranged between first sides of the first and second drain regions and the second and third source regions are arranged adjacent to second sides of the first and second drain regions. A fourth source region is arranged adjacent to third sides of the first and second drain regions. A fifth source region is arranged adjacent to fourth sides of the first and second drain regions. A gate region is arranged between the first, second, third, fourth and fifth source regions and the first and second drain regions. First and second drain contacts are arranged in the first and second drain regions.

A method for providing an integrated circuit comprises providing first and second drain regions having a generally rectangular shape; arranging a first source region between first sides of the first and second drain regions; arranging second and third source regions adjacent to second sides of the first and second drain regions; arranging a fourth source region adjacent to third sides of the first and second drain regions; arranging a fifth source region adjacent to fourth sides of the first and second drain regions; arranging a gate region between the first, second, third, fourth and fifth source regions and the first and second drain region; and arranging first and second drain contacts in the first and second drain regions.

In other features of the integrated circuit and method, the first, second and third source regions have a length that is substantially equal to a length of the first drain region and wherein the fourth and fifth source regions have a length that is greater than or equal to a length of the first and second drain regions. The first, second and third source regions have a width that is less than a width of the first drain region. The width of the first, second and third source regions is approximately one-half the width of the first drain region. The fourth and fifth source regions are driven from sides thereof. The first and second drain contacts have a size that is greater than a minimum drain contact size. The drain contacts have one of a regular shape and an irregular shape. The drain contacts are one of square, rectangular, and cross-shaped. The first, second and third source regions include source contacts. The first and second drain regions and the firs, second and third source regions are arranged in a first row and further comprising N additional rows, wherein drain regions of at least one of the N additional rows share one of the fourth and fifth source regions.

An integrated circuit comprises first and second drain regions having a generally rectangular shape. First, second and third source regions that have a generally rectangular shape, wherein the first source region is arranged between first sides of the first and second drain regions and the second and third source regions are arranged adjacent to second sides of the first and second drain regions. A fourth source region is arranged adjacent to third sides of the first and second drain regions. A fifth source region is arranged adjacent to fourth sides of the first and second drain regions. A gate region is arranged between the first, second, third, fourth and fifth source regions and the first and second drain regions. First and second drain contacts are arranged in the first and second drain regions.

A method for providing an integrated circuit comprises providing first and second drain regions having a generally rectangular shape; arranging a first source region between first sides of the first and second drain regions; arranging second and third source regions adjacent to second sides of the first and second drain regions; arranging a fourth source region adjacent to third sides of the first and second drain regions; arranging a fifth source region adjacent to fourth sides of the first and second drain regions; arranging a gate region between the first, second, third, fourth and fifth source regions and the first and second drain region; and arranging first and second drain contacts in the first and second drain regions.

In other features of the integrated circuit and method, the first, second and third source regions have a length that is substantially equal to a length of the first drain region and wherein the fourth and fifth source regions have a length that is greater than or equal to a length of the first and second drain regions. The first, second and third source regions have a width that is less than a width of the first drain region. The width of the first, second and third source regions is approximately one-half the width of the first drain region. The fourth and fifth source regions are driven from sides thereof. The first and second drain contacts have a size that is greater than a minimum drain contact size. The drain contacts have one of a regular shape and an irregular shape. The drain contacts are one of square, rectangular, and cross-shaped. The first, second and third source regions include source contacts. The first and second drain regions and the first, second and third source regions are arranged in a first row and further comprising N additional rows, wherein drain regions of at least one of the N additional rows share one of the fourth and fifth source regions.

Further regions of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
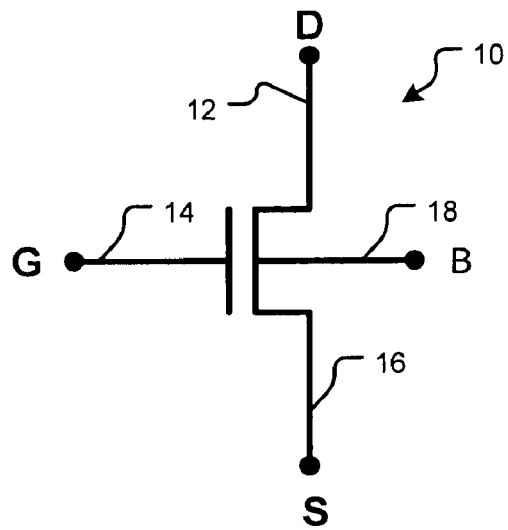
FIG. 1 is an electrical symbol for a transistor with a drain, source, gate and body according to the prior art.
Figure 2:
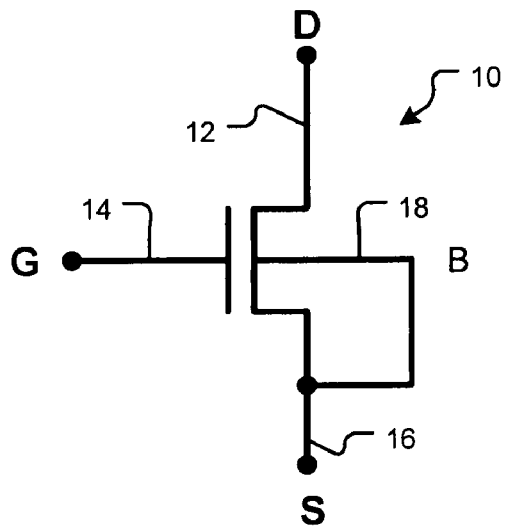
FIG. 2 is an electrical symbol for a transistor with a drain, source, gate and body, which is connected to the source according to the prior art.
Figure 3:
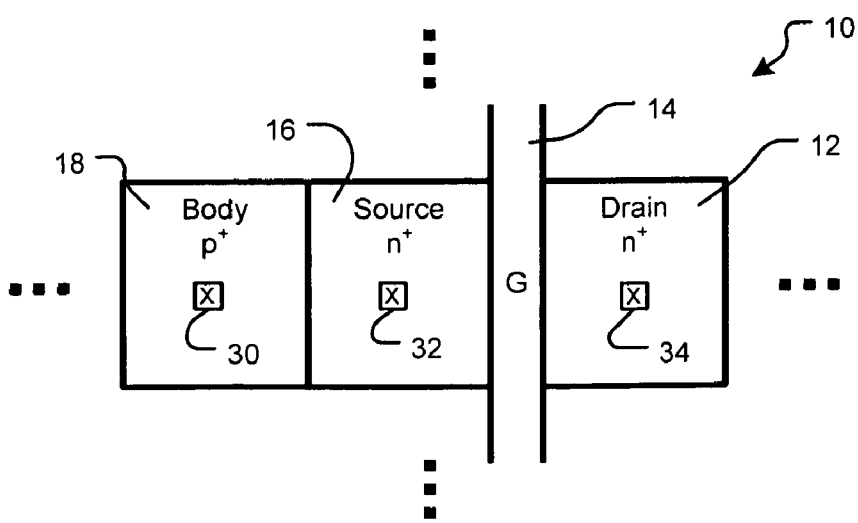
FIG. 3 is an exemplary layout of the transistor of FIG. 2 according to the prior art.
Figure 4:
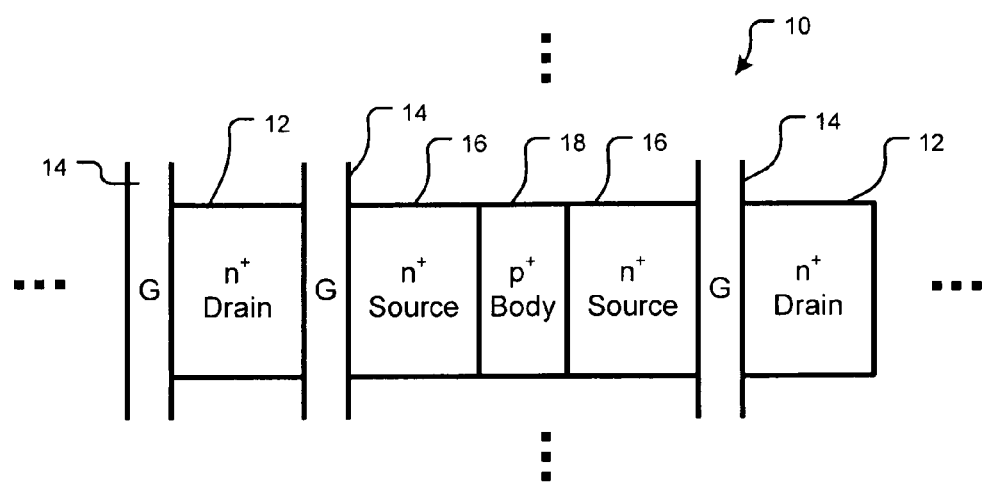
FIG. 4 is an exemplary layout of multiple transistors that are arranged in a row according to the prior art.

The following description of the preferred embodiment(s) is merely exemplary in nature and is in no way intended to limit the invention, its application, or uses. For purposes of clarity, the same reference numbers will be used in the drawings to identify the same elements. Additional transistors can be arranged on one or more sides of the illustrated transistors that are shown in the FIGs. as indicated by " . . . " in the FIGs.

Figure 5A:
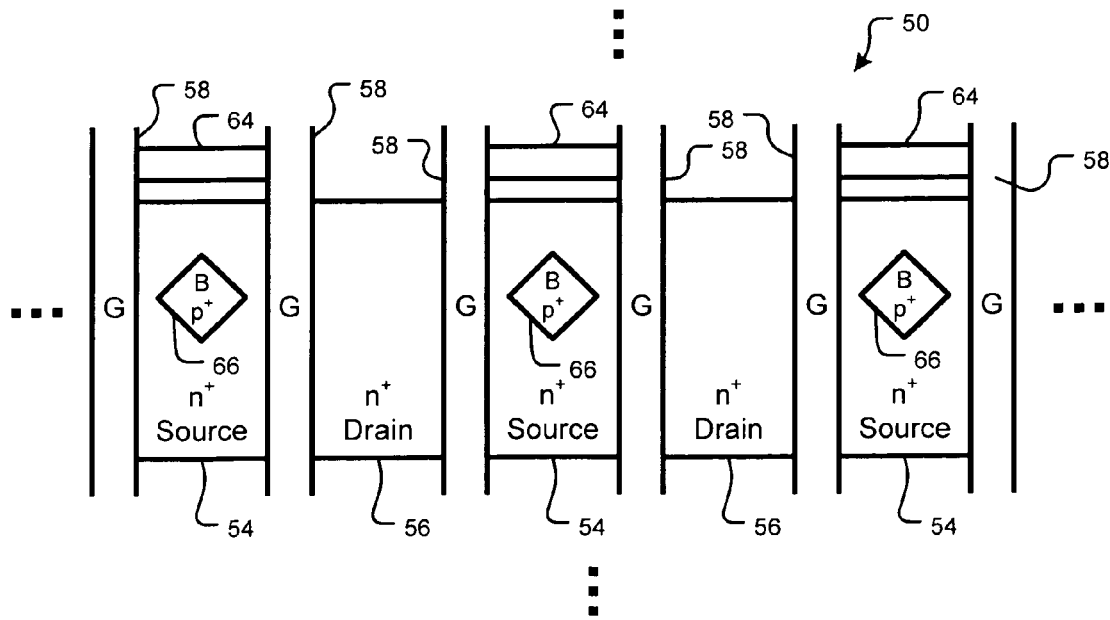
FIG. 5A is a first exemplary layout of transistors including a body that is arranged in the source.
Figure 5B:
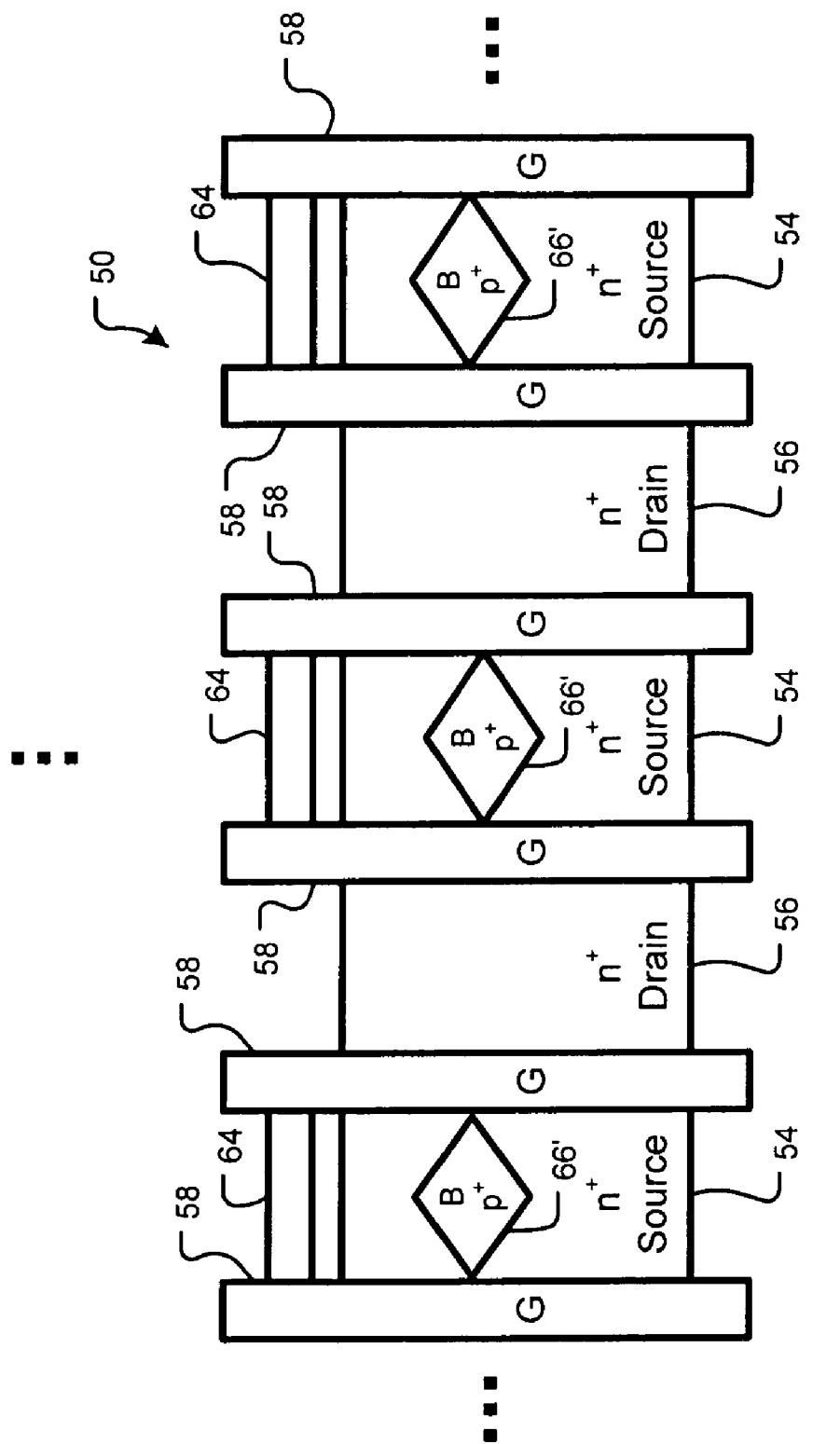
FIG. 5B is a second exemplary layout of transistors including a body having edges that align with the gates in plan view.

Referring now to FIGS. 5A and 5B, a transistor 50 according to the present invention is shown to include one or more sources 54 and one or more drains 56. The sources 54 and the drains 56 include $n^+$ regions. While an NMOS transistor is shown, skilled artisans will appreciate that the present invention also applies to other types of transistors such as PMOS transistors. Gates 58 are located between adjacent pairs of sources 54 and drains 56. In one implementation, the gates 58 that are located on opposite sides of the sources 54 are connected together as shown at 64. In other configurations, however, the gates 58 need not be connected together.

A body 66 including a $p^+$ region is arranged inside of and is surrounded by the source 54. The body 66 preferably has a shape that tapers as a distance between a midportion of the body 66 and adjacent gates decreases. The body 66 may touch or not touch the gates 58 in the plan views of FIGS. 5A and 5B. In other words, one or both edges of the body 66 may be spaced from the gates 58 in plan view (as shown in FIG. 5A) and/or substantially aligns with the gates in plan view (as shown in FIG. 5B). By utilizing some of the area of the source 54 for the body 66, the overall size of the transistor 50 is reduced as compared to conventional transistors. In the exemplary implementation that is shown in FIG. 5, the body 66 has a diamond shape.

Figure 6:
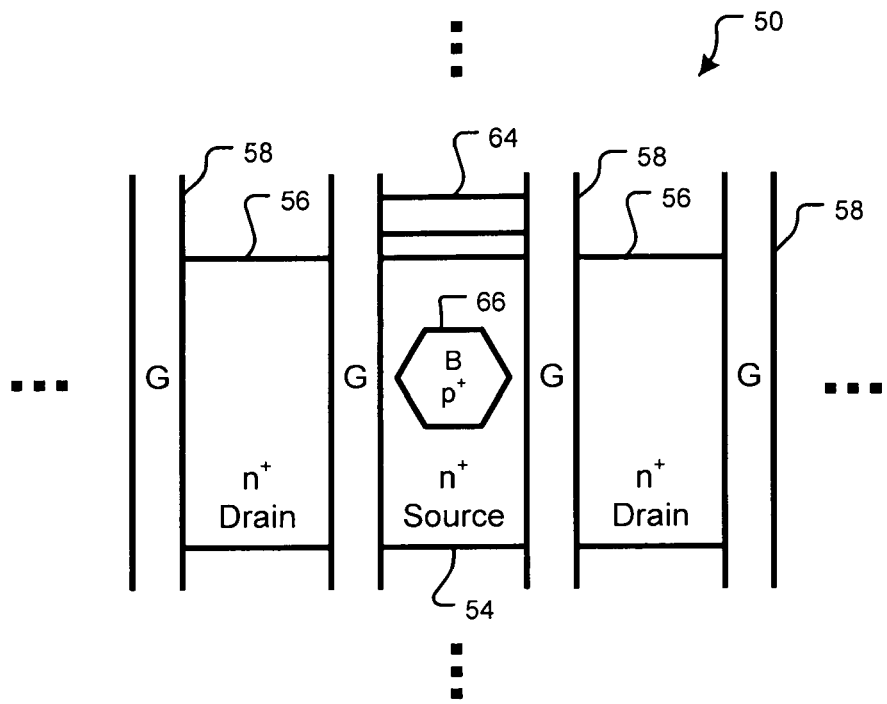
FIG. 6 is a second exemplary layout of transistors including a body that is arranged in the source.
Figure 7:
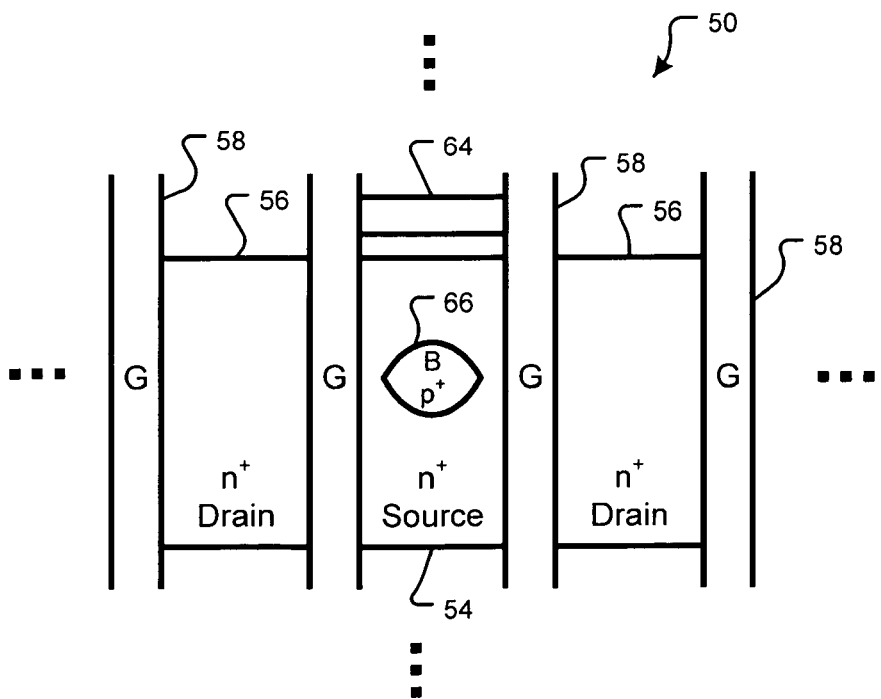
FIG. 7 is a third exemplary layout of transistors including a body that is arranged in the source.
Figure 8:
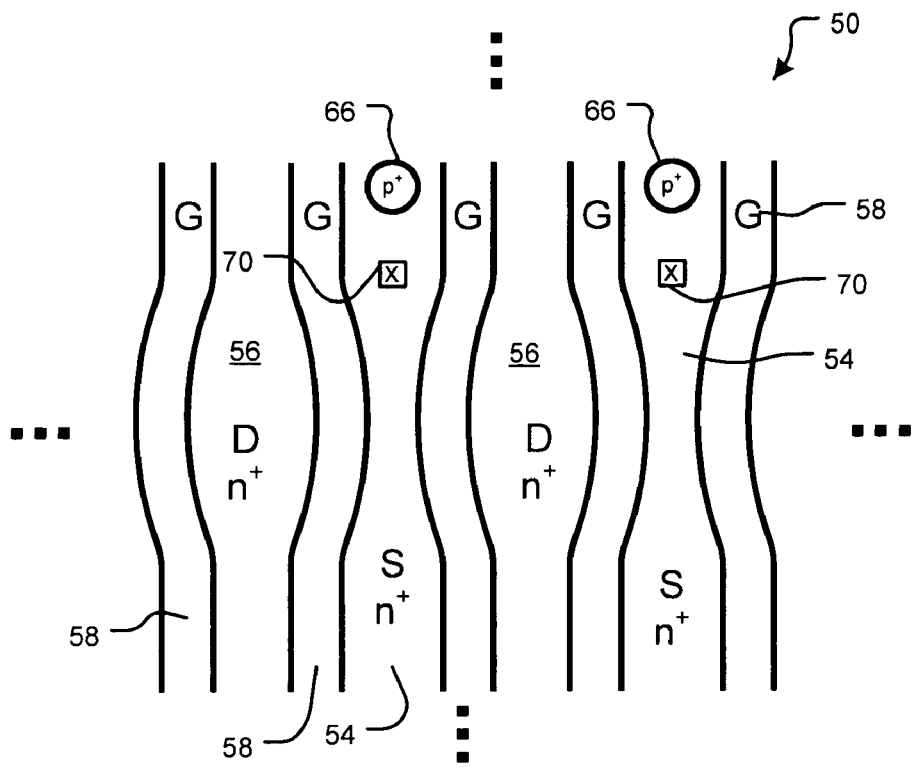
FIG. 8 is a fourth exemplary layout of transistors including a body that is arranged in the source.

Referring now to FIGS. 6 and 7, other exemplary shapes for the body 66 are shown. In FIG. 6, the body 66 has a hexagon shape. In FIG. 7, the body is generally football shaped. Skilled artisans will appreciate that there are a wide variety of other suitable shapes. For example, a circular body is shown in FIG. 8, which is described. Other suitable shapes include an ellipse, an octagon, etc.

Figure 9:
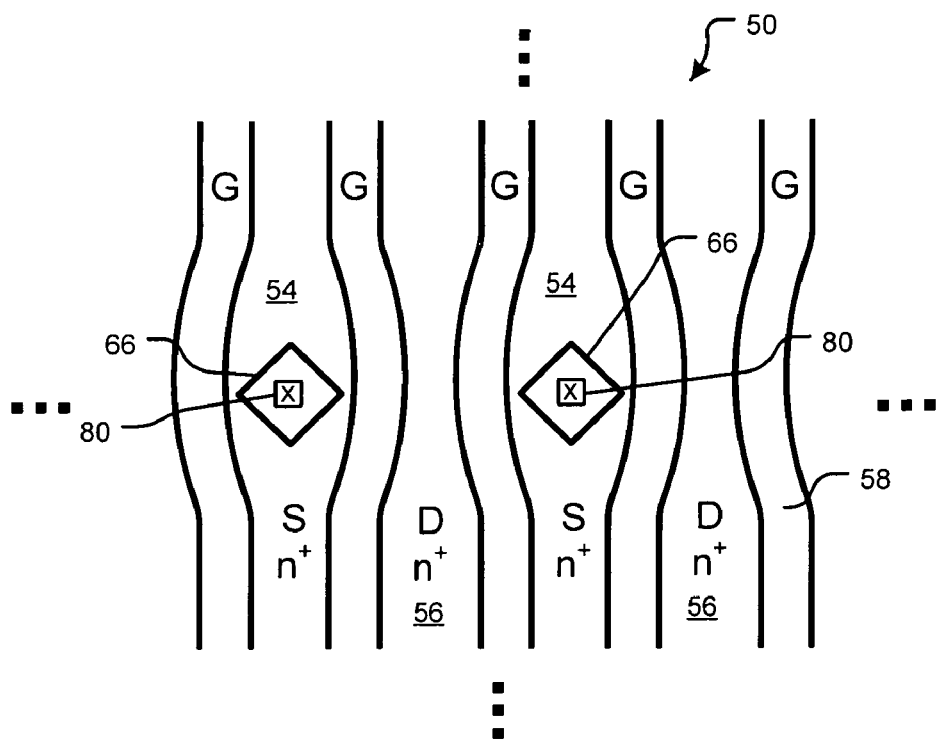
FIG. 9 is a fifth exemplary layout of transistors including a body that is arranged in the source.

Referring now to FIGS. 8 and 9, the gates 58 can be arranged such that they are closer together when there are no contact taps and further apart when there are contact taps. In FIG. 8, a source contact tap 70, which is not located in the body 66, is located in a region where the adjacent gates 58 are located farther apart. In FIG. 9, a body contact tap 80, which is located in the body 66, is located in the source 54 where the adjacent gates 58 are located farther apart.

Figure 10:
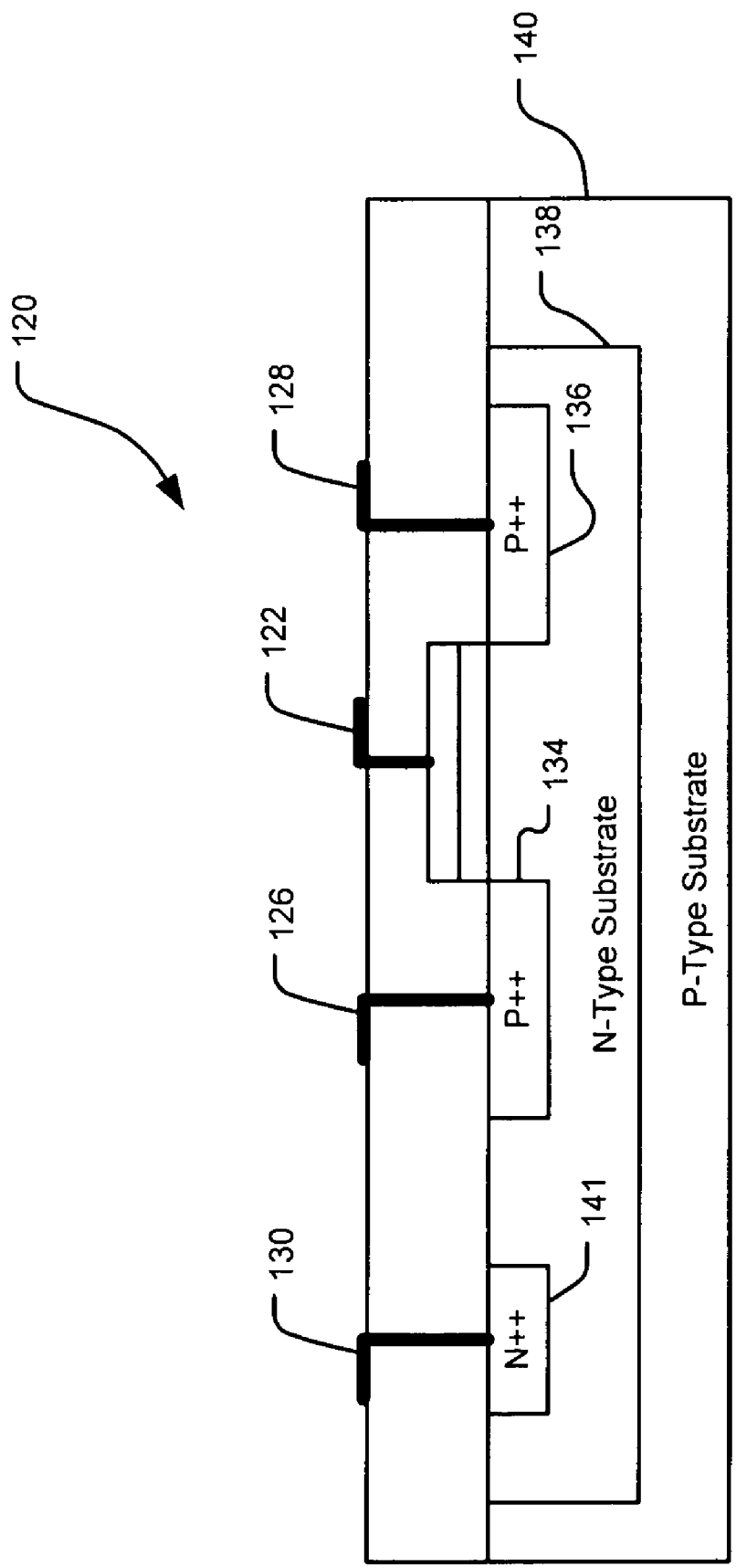
FIG. 10 is a cross-sectional view of a PMOS transistor according to the prior art.

Referring now to FIG. 10, a PMOS transistor 120 is shown. The transistor 120 includes a gate contact 122, a source contact 126, a drain contact 128 and a negative (N)-well contact 130. The source contact 126 provides a connection to a P++ region 134 formed an N-type substrate layer 138. The N-type layer 138, in turn, is formed in a P-type substrate 140. The P++ region 134 forms the source. The drain contact 128 provides an electrical connection to a P++ region 136 formed in the N-type layer 138. The P++ region 136 forms the drain. The N-well contact 130 provides a connection to an N++ region 141 or N-well.

Figure 11:
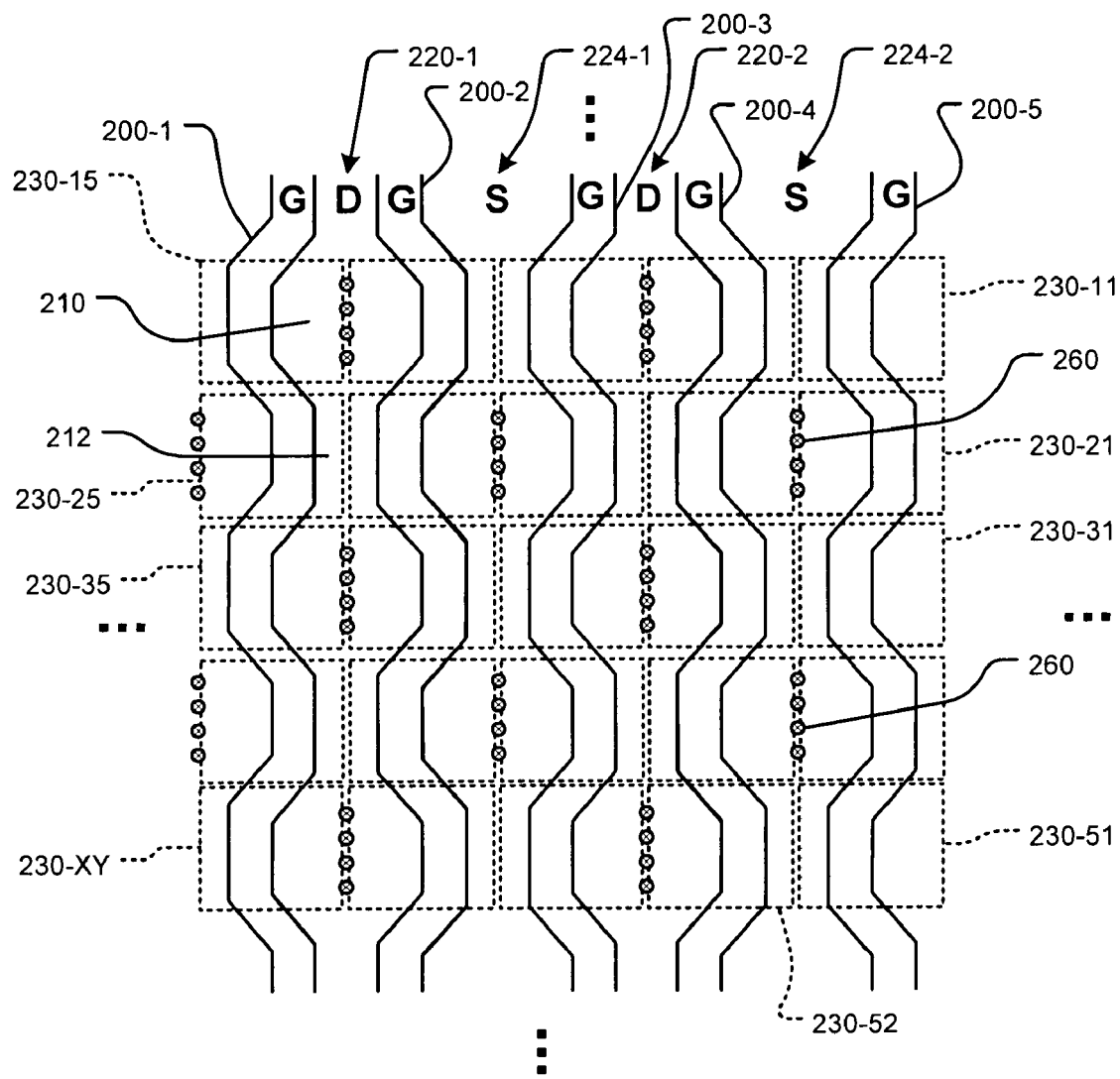
FIG. 11 is a plan view of a sixth exemplary layout including well substrate contacts.

Referring now to FIG. 11, a plan view of a sixth exemplary layout is shown. For some transistor designs such as PMOS and/or NMOS transistors, electrostatic discharge (ESD) is less important than other design criteria. Therefore, N-well contact areas can be minimized. For PMOS transistors, the N-well contact area may be approximately 2.5 to 3 times the area in NMOS transistors. The source-drain resistance may be less important. Therefore, the layout in FIG. 11 minimizes the N-well contact areas and the source-drain area. Skilled artisans will appreciate that while the foregoing description relates to PMOS transistors, similar principles apply to NMOS transistors.

In a layout shown in FIG. 11, gate regions 200-1, 200-2, ..., and 200-G (collectively gate regions or gates 200) are defined between source regions 224-1, 224-2, ..., and 224-S (collectively source regions 224) and drain regions 220-1, 220-2, ..., and 220-D (collectively drain regions 220). Adjacent gates 200-1 and 200-2 define regions 210 having a wider width than adjacent regions 212 having narrower widths. Drain regions 220 and source regions 224 are alternately defined between the adjacent gates 200.

Groups of transistors 230-11, 230-12, ..., and 230-XY (collectively groups of transistors 230) are arranged adjacent to each other. Adjacent groups of transistors 230 share R N-well contacts 260, where R is an integer greater than one. The R N-well contacts 260 can be located between the adjacent groups of transistors 230 in regions 210 where the gates 200 are spaced further apart.

The source-drain area is minimized by this layout. For example, each group may include 4-6 transistors. The R N-well contacts 260 are provided for adjacent groups in both vertical and horizontal directions. Therefore, abutting edges of the adjacent groups without the R N-well contacts 260 can be located in regions 212 where the gates are spaced closer together. In other words, the gates 200 can be arranged closer together to minimize areas of the regions 212 without the R N-well contacts 260.

Figure 12A:
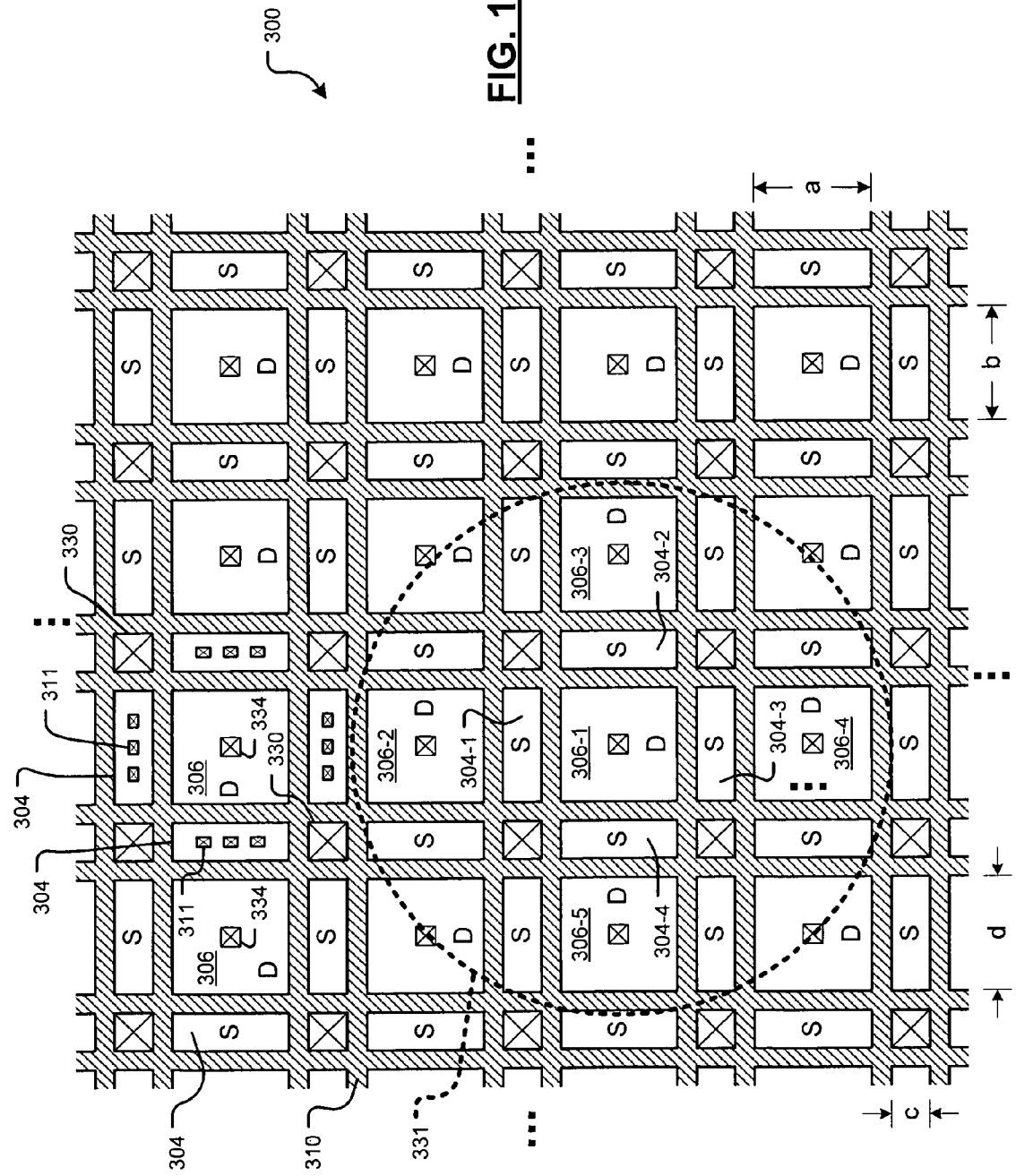
FIG. 12A is a plan view of a seventh exemplary layout for reducing $R_{DSon}$.

Referring now to FIG. 12A, an exemplary high-density layout for laterally diffused MOSFET (LDMOS) transistors 300 is shown. The layout tends to reduce turn-on drain-source resistance $R_{DSon}$. The transistors 300 include source (S) regions 304, drain (D) regions 306 and gates 310. Some, none or all of the source regions 304 may include one or more source contacts 311. For illustration purposes, not all of the source regions 304 are shown with source contacts 311.

The gates 310 define a checkerboard pattern. Source regions 304 are arranged along sides of the drain regions 306. More particularly, the drain regions 306 may have a generally rectangular shape. The source regions 304 may be arranged along each side of the generally rectangular drain regions 306. Substrate contacts 330 may be provided adjacent to corners of the drain regions 306 at intersections between adjacent source regions 304. Drain contacts 334 may also be provided at a central location within the drain regions 306.

Each drain region 306 may be arranged adjacent to source regions 304 that are common with other adjacent drain regions 306. For example in dotted area 331 in FIG. 12A, drain region 306-1 shares the source region 304-1 with the drain region 306-2. Drain region 306-1 shares the source region 304-2 with the drain region 306-3. Drain region 306-1 shares the source region 304-3 with the drain region 306-4. Drain region 306-1 shares the source region 304-4 with the drain region 306-5. This pattern may be repeated for adjacent drain regions 306.

Each of the drain regions 306 may have an area that is greater than or equal to two times the area of each of the source regions 304. In FIG. 12A, the drain regions 306 have a width "b" and a height "a". The source regions 304 have a width (or height) "d" and a height (or width) "c". The drain regions 306 may have substantially the same length as the source regions 304. The drain regions 306 may have greater than or equal to two times the width of the source regions 304.

Figure 12B:
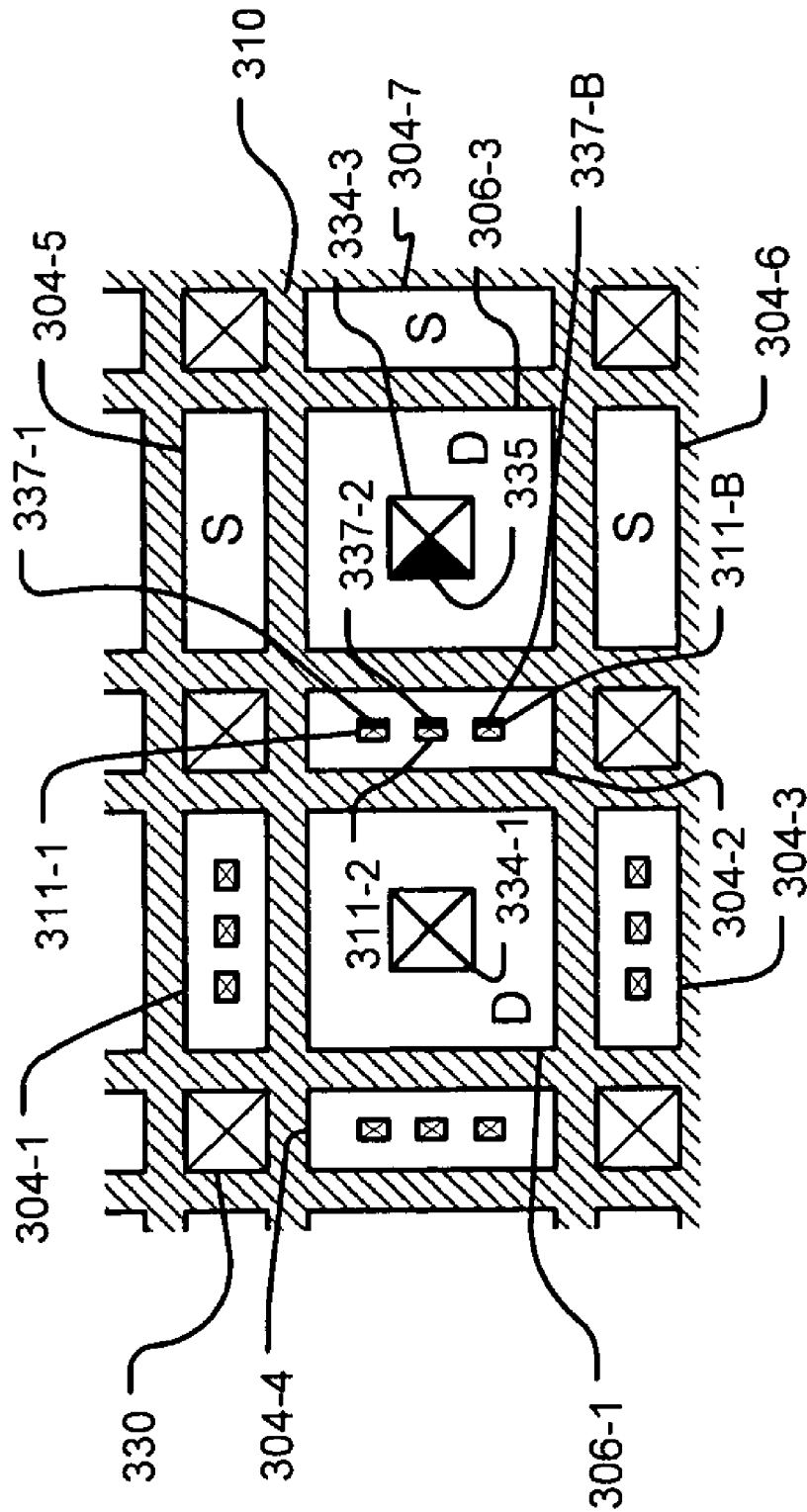
FIG. 12B is a plan view of the seventh exemplary layout of FIG. 12A.

Referring now to FIG. 12B, a more detailed view of part of the layout of FIG. 12A is shown. Drain contacts 334-1 and 334-3 may be associated with drain regions 306-1 and 306-3, respectively. Substrate contacts 330 are located adjacent to corners of the drain regions 306-1. Source contacts 311-1, 311-2, ... and 311-B may be arranged in source regions 304-2 and 304-4, where B is an integer. Drain contacts 334-1 and 334-3 may be arranged in each of the drain regions 306-1 and 306-3, respectively. Drain contact 334-1 may define an area that is greater than the area of the source contact 311-1 in the source region 304-2.

Substantially all of the current flowing between the drain region 306-3 and the source contacts 311-1, 311-2, ... and 311-B of the adjacent source region 304-2 flows between a facing portion 335 of the drain contact 334-3 and facing halves 337-1, 337-2, ... and 337-S of source contacts 311-1, 311-2, ... and 311-B in the source region 304-2. Current flows in a similar manner between other facing portions of the drain contact 334-3 and source contacts (not shown) in other adjacent source regions 304-5, 304-6 and 304-7.

Figure 12C:
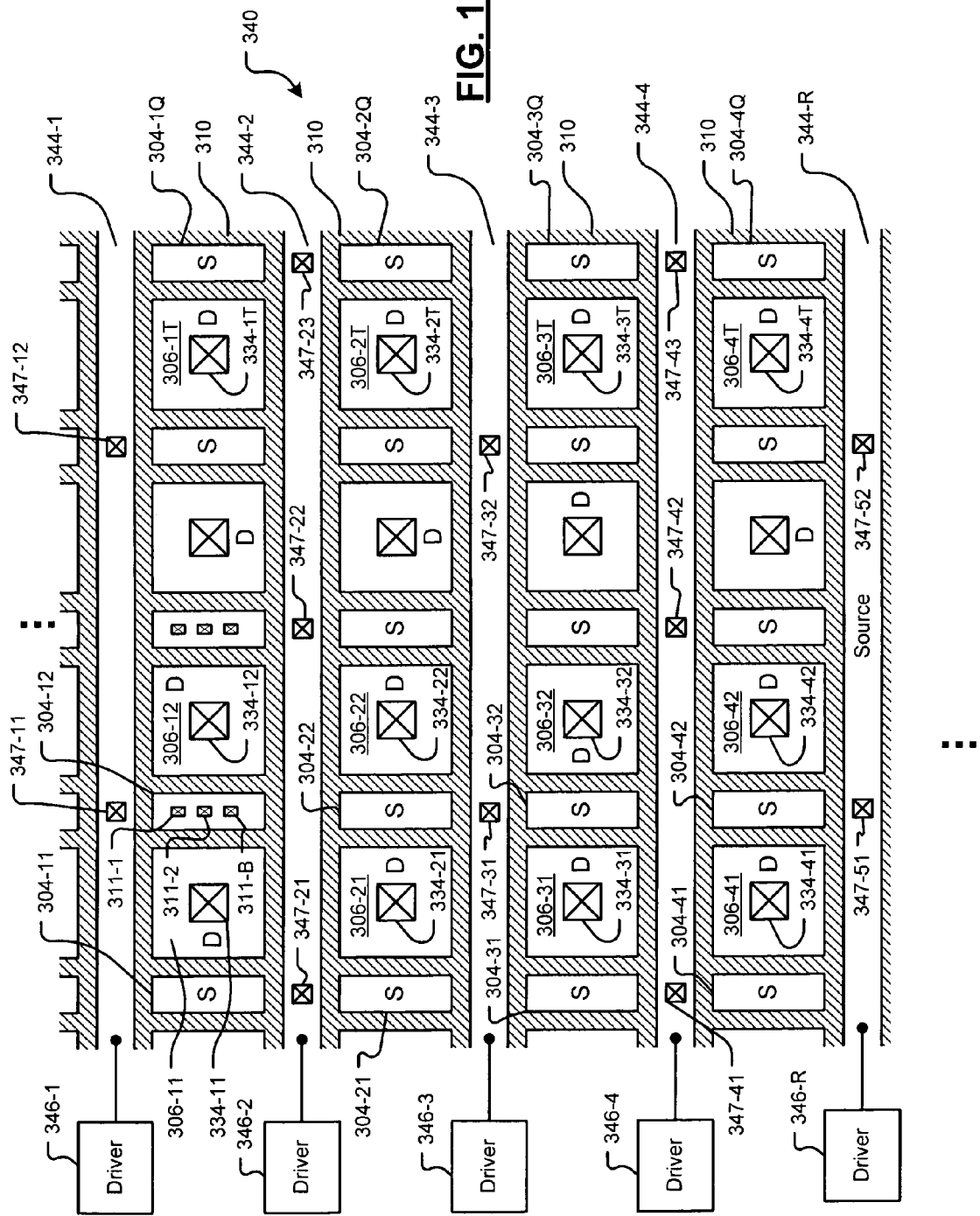
FIG. 12C is a plan view of an eighth exemplary layout for reducing $R_{DSon}$.

Referring now to FIG. 12C, another exemplary high-density layout for laterally diffused MOSFET (LDMOS) transistors 340 is shown. The layout tends to provide low turn-on drain-source resistance $R_{DSon}$. The transistors 340 include source regions 304-11, 304-12, ... 304-4Q, drain regions 306-11, 306-12, ... 306-4T and gates 310, where Q and T are integers. While four rows are shown in FIG. 12B, additional and/or fewer rows and/or columns may be employed. Some, none or all of the source regions 304 may include source contacts 311. For illustration purposes, not all of the source regions 304 are shown with source contacts. For example, source region 304-12 includes source contacts 311-1, 311-2, ... and 311-B, where B is an integer.

Other elongated source regions 344-1, 344-2, 344-3, ... and 344-R are arranged between rows (or columns) of drain regions 306 and may be driven by drivers 346-1, 346-2, ..., and 346-R arranged on one or both sides (or tops) of the layout in FIG. 12B. The elongated source regions 344-1, 344-2, 344-3, ... and 344-R may extend adjacent to sides of at least two drain regions 306 such as at least drain regions 306-11 and 306-12.

Each of the drain regions 306 (such as drain region 306-11) may have an area that is greater than or equal to two times the area of each of the source regions 304 (such as source region 304-12). The drain regions 306 (such as drain region 306-11) may have substantially the same length as the source regions 304 (such as source region 304-12). The drain regions 306 (such as drain region 306-11) may have greater than or equal to two times the width of the source regions 304 (such as source region 304-12).

Substrate contacts 347-11, 347-12, 347-21, 347-22, 347-23, ... 347-51, 347-52 (collectively substrate contacts 347) may be arranged in some, none or all of the elongated source regions 344. The placement and number of substrate contacts 347 may be uniform or varied for each of the elongated source regions 344. For example only, the substrate contacts 347 shown in FIG. 12C may be offset from the substrate contacts 347 in adjacent elongated source regions 344. Each of the elongated source regions 344 may include the same number or a different number of substrate contacts 347 than adjacent elongated source regions 344. The substrate contacts 347 may be aligned or offset as shown. Some elongated source regions 344 may include no substrate contacts 347. Still other variations are contemplated.

Figure 12D:
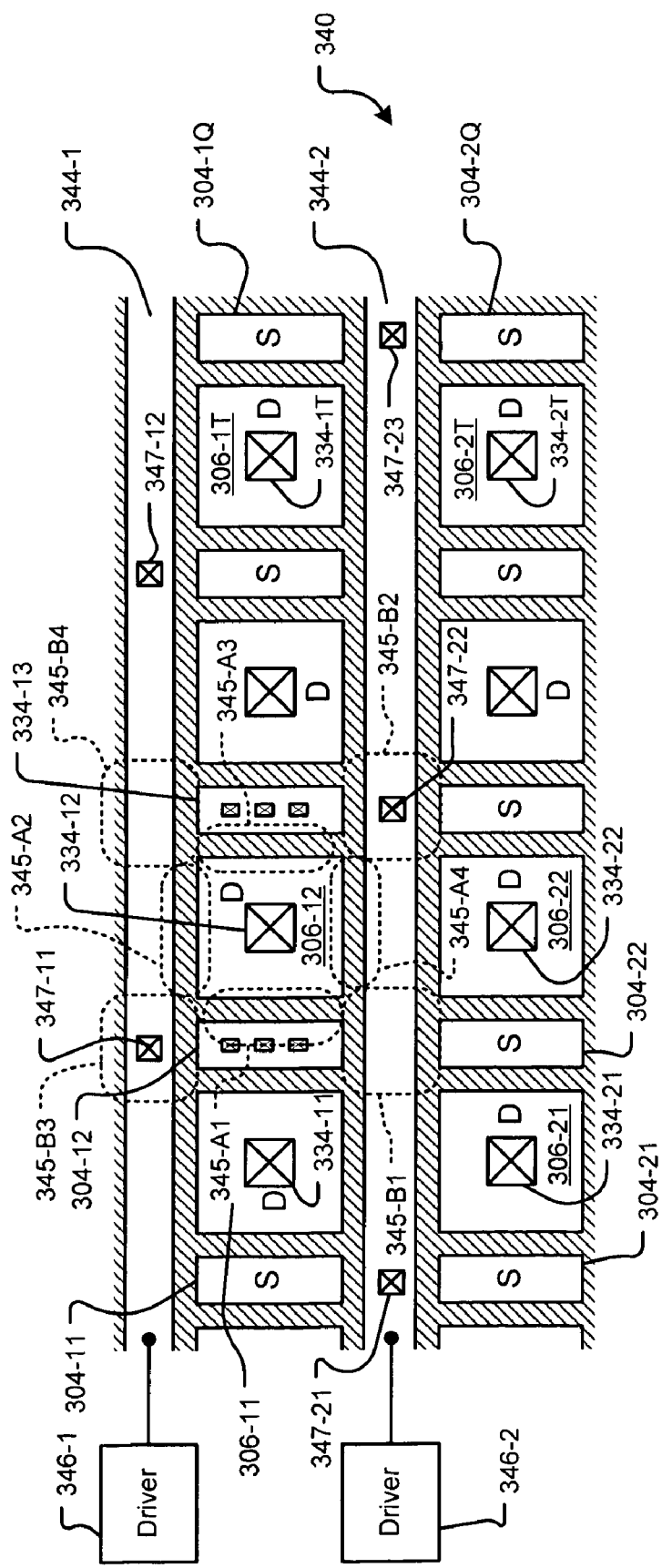
FIG. 12D is a plan view of a ninth exemplary layout for reducing $R_{DSon}$ that is similar to FIG. 12C.

Referring now to FIG. 12D, first areas 345-A1, 345-A2, 345-A3 and 345-A4 may provide useful transistor areas. For example, first areas 345-A1, 345-A2, 345-A3 and 345-A4 may be located between drain region 306-12 and source regions 304-12, 344-1, 304-13, and 344-2, respectively. Second areas 345-B1, 345-B2, 345-B3 and 345-B4 may provide less useful transistor areas. For example, second areas 345-B1, 345-B2, 345-B3 and 345-B4 may be located between source regions 304-12, 344-1, 304-13, and 344-2.

In some implementations, the substrate contacts 347-11, 347-12, 347-21, 347-22, 347-23, ... may be arranged in some, none or all of the second areas 345-B1, 345-B2, 345-B3 and 345-B4 of the source regions 344-1, 344-2, ... and 344-R, for example as shown in FIG. 12D. The substrate contacts 347-11, 347-12, 347-21, 347-22, 347-23, ... are shown arranged in the elongated substrate regions 344-1 and 344-2 and tend to lower $R_{DS\_ON}$. The substrate contacts 347-11, 347-12, 347-21, 347-22, 347-23, ... may have a height that is less than or equal to a width "c" of the source regions 304 (as shown in FIG. 12A) and a width that is less than or equal to a width "d" of the source regions 304 (as shown in FIG. 12A).

Figure 12E:
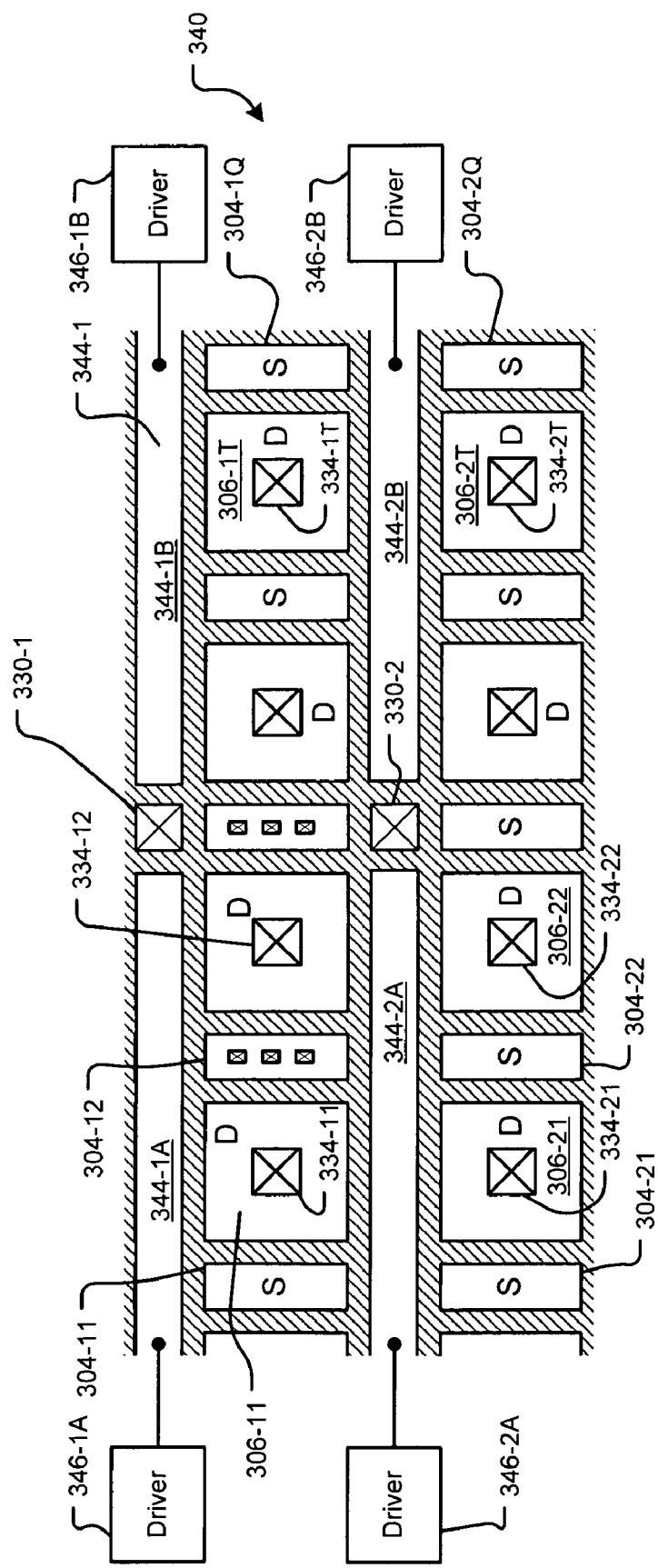
FIG. 12E is a plan view of a tenth exemplary layout for reducing $R_{DSon}$ that is similar to FIG. 12C.

Referring now to FIG. 12E, substrate contacts 330-1 and 330-2 are provided between pairs of elongated source regions 344-1A and 344-1B and 344-2A and 344-2B, respectively. The elongated source regions 344-1A and 344-2A are driven from one side by drivers 346-1A and 346-2A. The elongated source regions 344-1B and 344-2B are driven from another side by drivers 346-1B and 346-2B.

Figure 12H:
FIGS. 12F-12I illustrate other exemplary drain contacts.
Figure 12I:
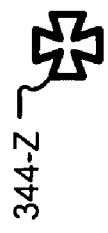
Figure 12F:
Figure 12G:

Drain contacts 334 in FIGS. 12A-12E may have a minimum size or a size that is greater than the minimum size. Drain contacts 334 may have a simple or regular shape and/or an irregular or complex shape. For example, the drain contacts 334 may have a square or rectangular shape (as shown at 344 in FIG. 12A), a cross shape (as shown at 344-W in FIG. 12F), clover-leaf shapes (as shown at 334-X and 334-Y in FIGS. 12G and 12H, respectively), a modified cross-shaped region (as shown at 334-Z in FIG. 12I) and/or other suitable shapes such as but not limited to diamond, circular, symmetric, non-symmetric, etc. The substrate contacts 347 may similarly have a simple or regular shape and/or an irregular or complex shape similar to the drain contacts 334.

In some implementations, the number of source contacts B in a given source region may be an integer that is greater than one and less than six. In some implementations, B may be equal to 3 or 4. The area of the drain contact 334-3 may be greater than or equal to 2*B* (the area one of source contacts 311-1, 311-2, ... or 311-B). For example, when B is equal to 3, the drain contact region 334-3 may have an area that is approximately greater than or equal to 6 times an area of one source contact 311-1, 311-2, ... or 311-B. When B is equal to 4, the drain contact region 334-3 may an area that is approximately greater than or equal to 8 times an area of one source contact 311-1, 311-2, ... or 311-B.

As the size of the drain contacts 334 increases relative to the corresponding drain region 306, over-etching may occur. In other words, the etching process may adversely impact adjacent regions and/or underlying layers. To alleviate the problems of over-etching, the complex shapes in FIGS. 12F-12I and/or other complex shapes can be employed for the drain contacts 334. Alternately, the drain contacts 334 can employ deep implant ions in and/or below the drain contacts 334.

As an alternative to placing the substrate contact 330 in the elongated source regions 344, a relief area may be provided in one or both sides of the source region 344 in areas 345-B1, 345-B2, 345-B3 and 345-B. A substrate contact region 330 can be positioned in the relief area. The shape of the elongate source region 344 can be adjusted on an opposite side of the relief area to offset the effect of the relief area and to prevent reduction in current density in areas of the elongate source region 344 near the relief areas.

Figure 13:
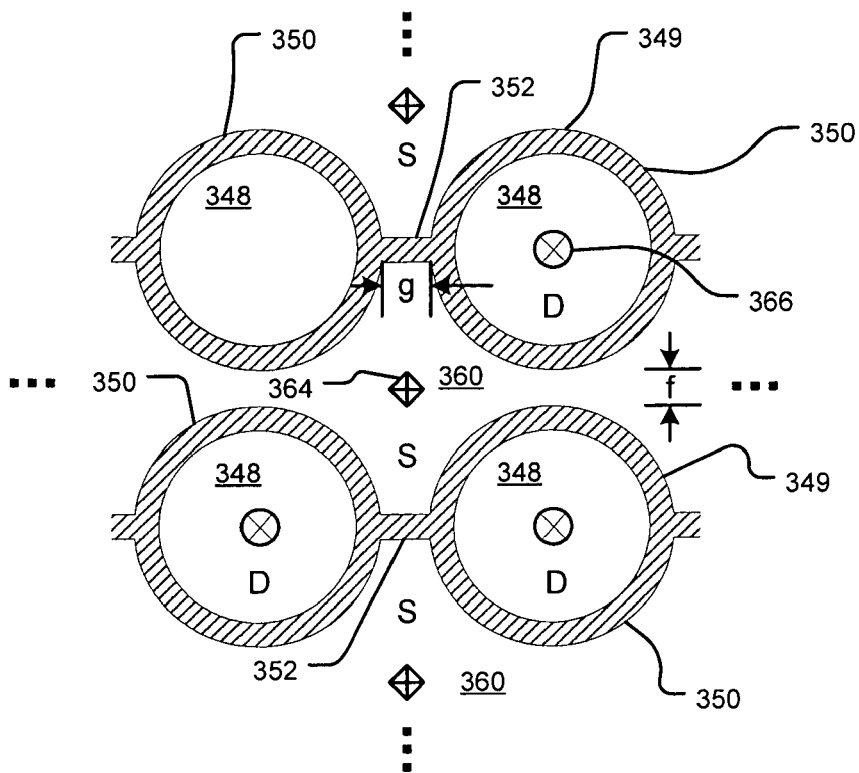
FIG. 13 is a plan view of a eleventh exemplary layout for reducing $R_{DSon}$.
Figure 14:
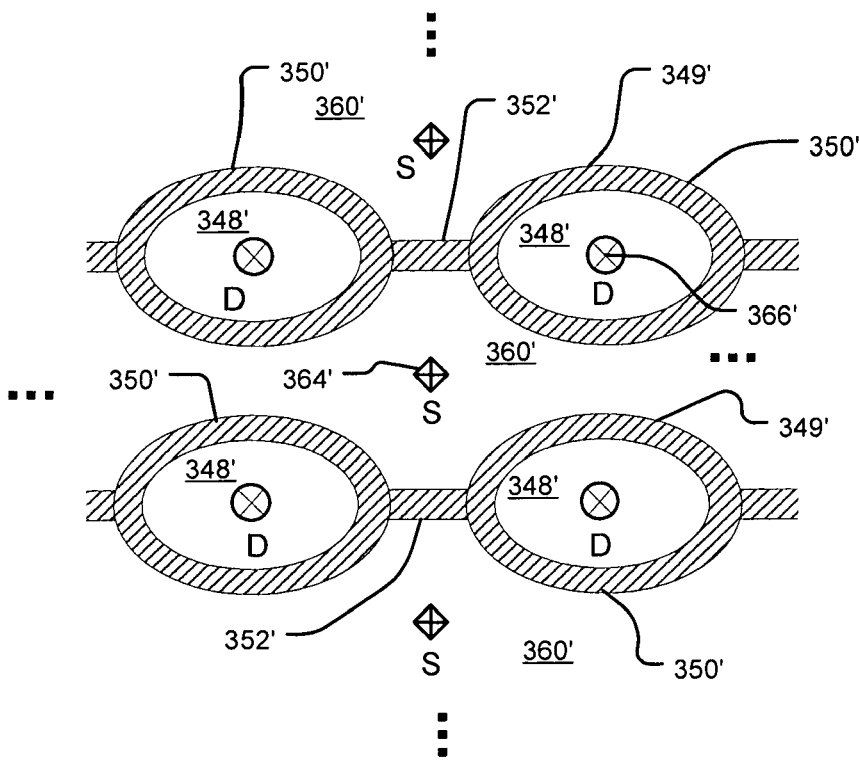
FIG. 14 is a plan view of a twelfth exemplary layout for reducing $R_{DSon}$.
Figure 15:
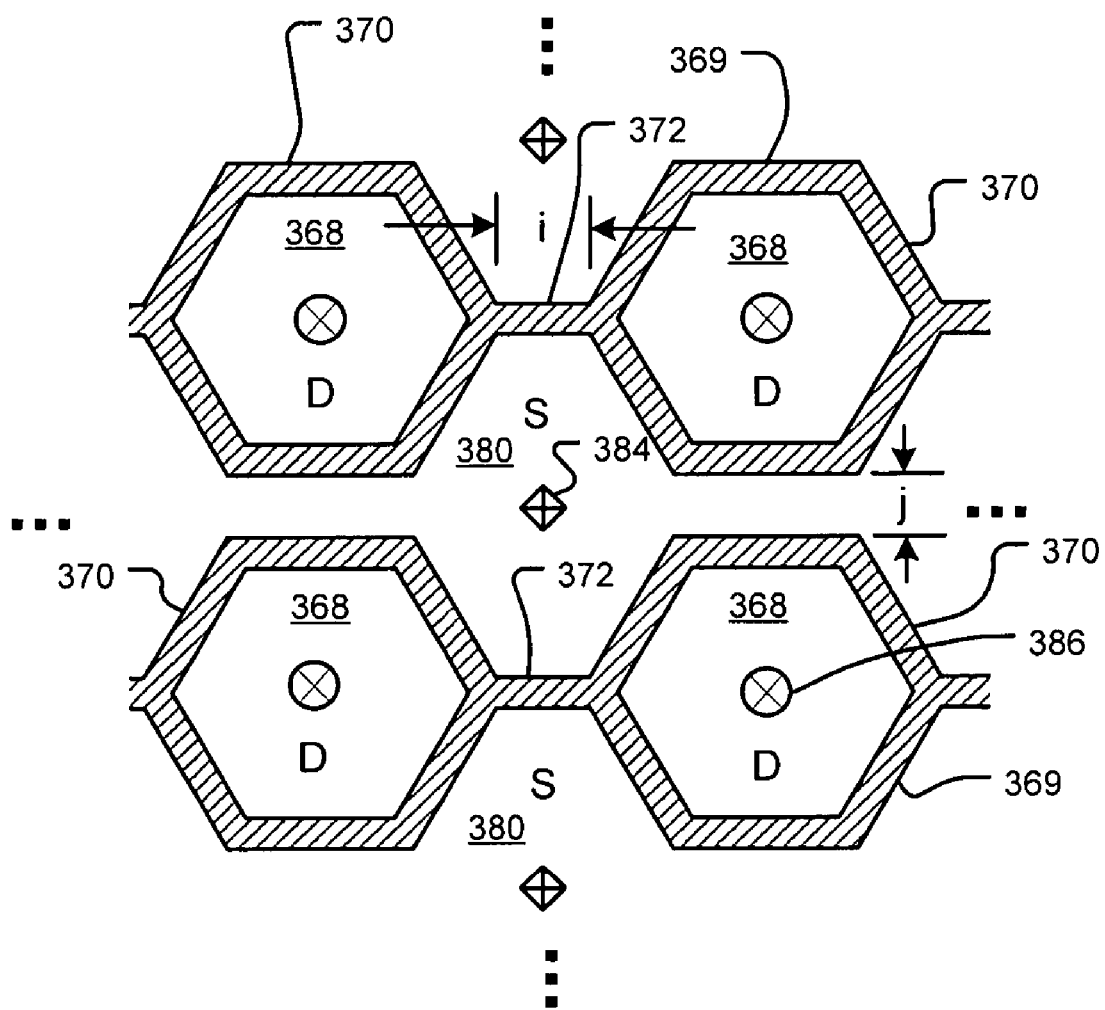
FIG. 15 is a plan view of a thirteenth exemplary layout for reducing $R_{DSon}$.

Referring now to FIGS. 13-15, drain, source and gate regions can also have other shapes that can be used to minimize $R_{DSON}$. For example, drain regions 348 can have a circular shape as shown in FIG. 13, an elliptical shape as shown in FIG. 14 and/or other suitable shapes. Gate regions 349 include circular-shaped gate regions 350 that are connected by linear gate connecting regions 352. Similar elements are identified in FIG. 14 using a prime symbol ("'"). The drain regions 348 are located in the circular-shaped gate regions 350. Source regions 360 are located in between the gate regions 349 in areas other than the inside of the circular shaped gate regions 350. Substrate contacts 364 are located in the source regions 360. The drain regions 348 may also include a contact region 366. The linear gate regions 352 may have a vertical spacing "g" that is minimized to increase density. Likewise, lateral spacing identified at "f" between adjacent circular-shaped gate regions 350 may be minimized to increase density.

Drain areas 368 can also have polygon shapes. For example, the drain areas can have a hexagon shape as shown in FIG. 15, although other polygon shapes can be used. Gate regions 369 include hexagon-shaped gate regions 370 that are connected by linear gate connecting regions 372. The drain regions 368 are located in the hexagon-shaped gate regions 370. Source regions 380 are located in between the gate regions 369 in areas other than the inside of the hexagon-shaped gate regions 370. Substrate contacts 384 are located in the source regions 380. The drain regions may also include a contact region 386. The linear gate connecting regions 372 preferably have a vertical spacing "j" that is minimized to increase density. Likewise lateral spacing identified at "i" between adjacent hexagon-shaped gate regions 370 is minimized to increase density.

As can be appreciated, the shapes for the drain and gate areas in FIGS. 13-15 can be any shape that is symmetric about at least one of the horizontal and vertical centerlines of the drain areas. The transistors in FIGS. 13-15 may be LDMOS transistors. The shape of the drain regions may include any symmetric shape. The shape may taper as a distance from a center point of the drain area increases and/or as a center point of the drain area increases in a direction towards one or more other transistors.

Referring now to FIGS. 16A-16G, various exemplary implementations incorporating the teachings of the present disclosure are shown.

Figure 16A:
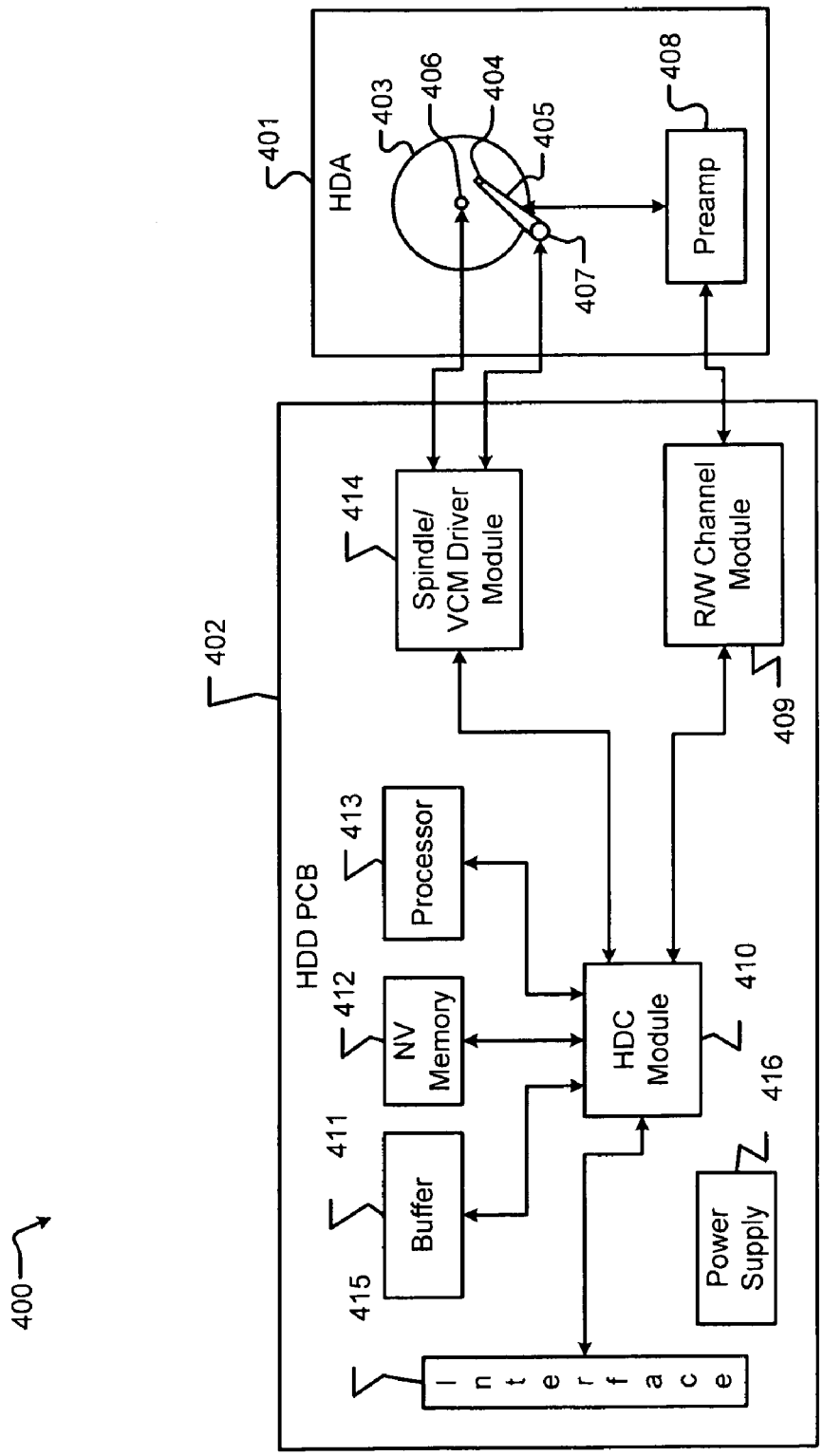
FIG. 16A is a functional block diagram of a hard disk drive.

Referring now to FIG. 16A, the teachings of the disclosure can be implemented in a transistors of a hard disk drive (HDD) 400. The HDD 400 includes a hard disk assembly (HDA) 401 and a HDD PCB 402. The HDA 401 may include a magnetic medium 403, such as one or more platters that store data, and a read/write device 404. The read/write device 404 may be arranged on an actuator arm 405 and may read and write data on the magnetic medium 403. Additionally, the HDA 401 includes a spindle motor 406 that rotates the magnetic medium 403 and a voice-coil motor (VCM) 407 that actuates the actuator arm 405. A preamplifier device 408 amplifies signals generated by the read/write device 404 during read operations and provides signals to the read/write device 404 during write operations.

The HDD PCB 402 includes a read/write channel module (hereinafter, "read channel") 409, a hard disk controller (HDC) module 410, a buffer 411, nonvolatile memory 412, a processor 413, and a spindle/VCM driver module 414. The read channel 409 processes data received from and transmitted to the preamplifier device 408. The HDC module 410 controls components of the HDA 401 and communicates with an external device (not shown) via an I/O interface 415. The external device may include a computer, a multimedia device, a mobile computing device, etc. The I/O interface 415 may include wireline and/or wireless communication links.

The HDC module 410 may receive data from the HDA 401, the read channel 409, the buffer 411, nonvolatile memory 412, the processor 413, the spindle/VCM driver module 414, and/or the I/O interface 415. The processor 413 may process the data, including encoding, decoding, filtering, and/or formatting. The processed data may be output to the HDA 401, the read channel 409, the buffer 411, nonvolatile memory 412, the processor 413, the spindle/VCM driver module 414, and/or the I/O interface 415.

The HDC module 410 may use the buffer 411 and/or nonvolatile memory 412 to store data related to the control and operation of the HDD 400. The buffer 411 may include DRAM, SDRAM, etc. The nonvolatile memory 412 may include flash memory (including NAND and NOR flash memory), phase change memory, magnetic RAM, or multi-state memory, in which each memory cell has more than two states. The spindle/VCM driver module 414 controls the spindle motor 406 and the VCM 407. The HDD PCB 402 includes a power supply 416 that provides power to the components of the HDD 400.

Figure 16B:
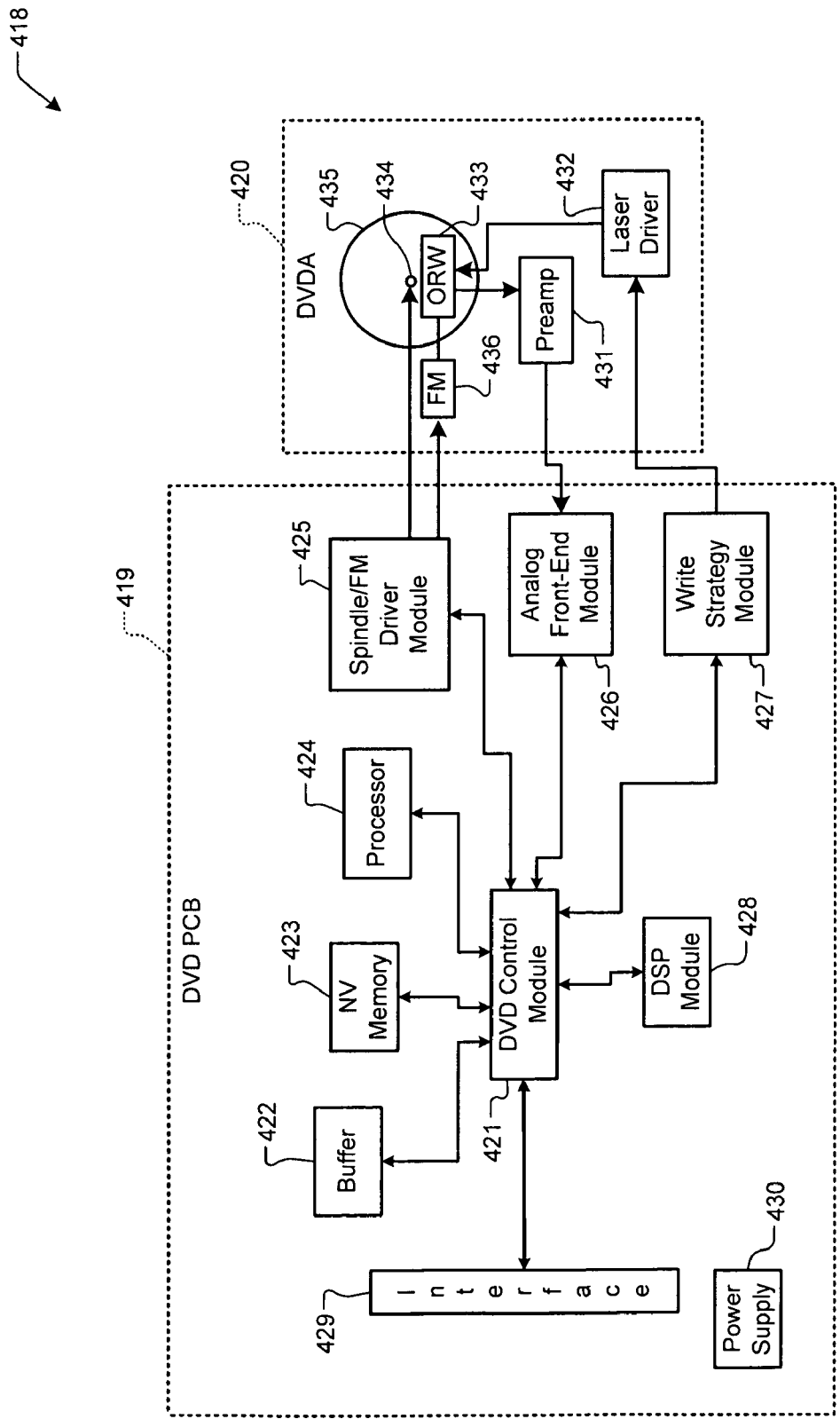
FIG. 16B is a functional block diagram of a DVD drive.

Referring now to FIG. 16B, the teachings of the disclosure can be implemented in a transistors of a DVD drive 418 or of a CD drive (not shown). The DVD drive 418 includes a DVD PCB 419 and a DVD assembly (DVDA) 420. The DVD PCB 419 includes a DVD control module 421, a buffer 422, nonvolatile memory 423, a processor 424, a spindle/FM (feed motor) driver module 425, an analog front-end module 426, a write strategy module 427, and a DSP module 428.

The DVD control module 421 controls components of the DVDA 420 and communicates with an external device (not shown) via an I/O interface 429. The external device may include a computer, a multimedia device, a mobile computing device, etc. The I/O interface 429 may include wireline and/or wireless communication links.

The DVD control module 421 may receive data from the buffer 422, nonvolatile memory 423, the processor 424, the spindle/FM driver module 425, the analog front-end module 426, the write strategy module 427, the DSP module 428, and/or the I/O interface 429. The processor 424 may process the data, including encoding, decoding, filtering, and/or formatting. The DSP module 428 performs signal processing, such as video and/or audio coding/decoding. The processed data may be output to the buffer 422, nonvolatile memory 423, the processor 424, the spindle/FM driver module 425, the analog front-end module 426, the write strategy module 427, the DSP module 428, and/or the I/O interface 429.

The DVD control module 421 may use the buffer 422 and/or nonvolatile memory 423 to store data related to the control and operation of the DVD drive 418. The buffer 422 may include DRAM, SDRAM, etc. The nonvolatile memory 423 may include flash memory (including NAND and NOR flash memory), phase change memory, magnetic RAM, or multi-state memory, in which each memory cell has more than two states. The DVD PCB 419 includes a power supply 430 that provides power to the components of the DVD drive 418.

The DVDA 420 may include a preamplifier device 431, a laser driver 432, and an optical device 433, which may be an optical read/write (ORW) device or an optical read-only (OR) device. A spindle motor 434 rotates an optical storage medium 435, and a feed motor 436 actuates the optical device 433 relative to the optical storage medium 435.

When reading data from the optical storage medium 435, the laser driver provides a read power to the optical device 433. The optical device 433 detects data from the optical storage medium 435, and transmits the data to the preamplifier device 431. The analog front-end module 426 receives data from the preamplifier device 431 and performs such functions as filtering and A/D conversion. To write to the optical storage medium 435, the write strategy module 427 transmits power level and timing information to the laser driver 432. The laser driver 432 controls the optical device 433 to write data to the optical storage medium 435.

Figure 16D:
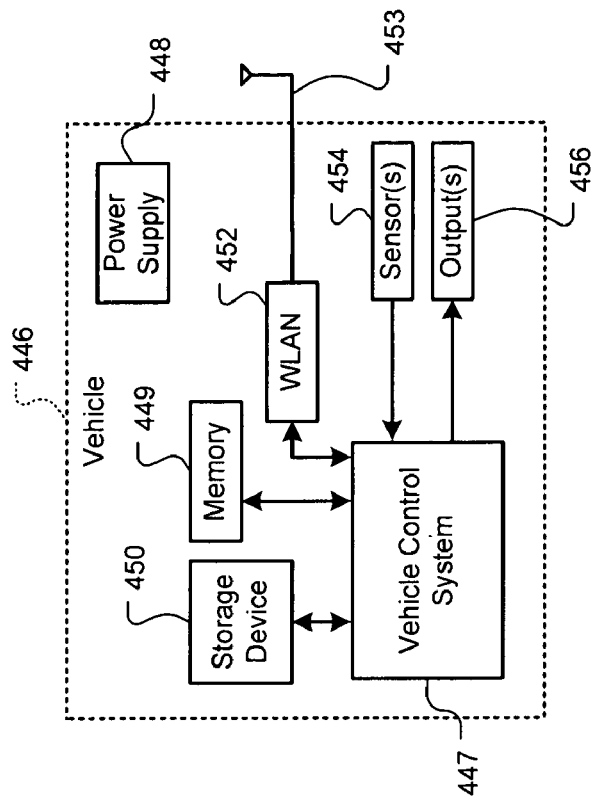
FIG. 16D is a functional block diagram of a vehicle control system.
Figure 16C:
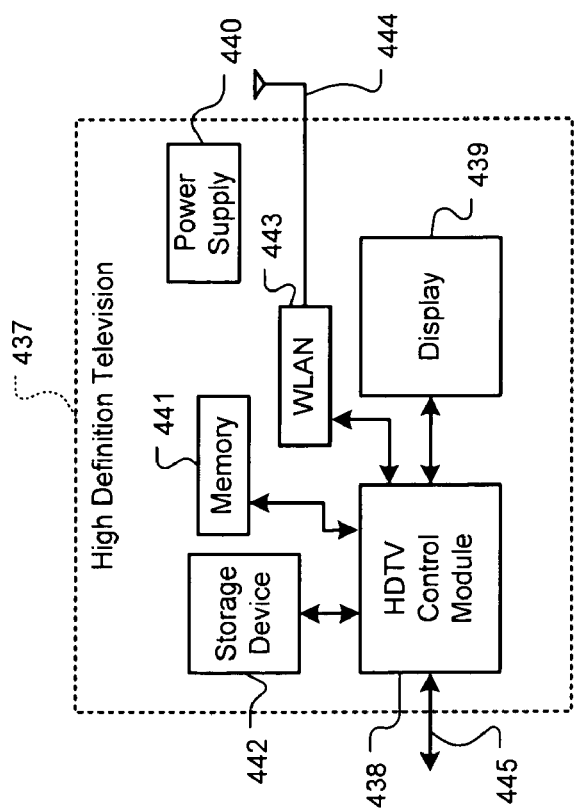
FIG. 16C is a functional block diagram of a high definition television.

Referring now to FIG. 16C, the teachings of the disclosure can be implemented in a transistors of a high definition television (HDTV) 437. The HDTV 437 includes a HDTV control module 438, a display 439, a power supply 440, memory 441, a storage device 442, a WLAN interface 443 and associated antenna 444, and an external interface 445.

The HDTV 437 can receive input signals from the WLAN interface 443 and/or the external interface 445, which sends and receives information via cable, broadband Internet, and/or satellite. The HDTV control module 438 may process the input signals, including encoding, decoding, filtering, and/or formatting, and generate output signals. The output signals may be communicated to one or more of the display 439, memory 441, the storage device 442, the WLAN interface 443, and the external interface 445.

Memory 441 may include random access memory (RAM) and/or nonvolatile memory such as flash memory, phase change memory, or multi-state memory, in which each memory cell has more than two states. The storage device 442 may include an optical storage drive, such as a DVD drive, and/or a hard disk drive (HDD). The HDTV control module 438 communicates externally via the WLAN interface 443 and/or the external interface 445. The power supply 440 provides power to the components of the HDTV 437.

Referring now to FIG. 16D, the teachings of the disclosure may be implemented in a transistors of a vehicle 446. The vehicle 446 may include a vehicle control system 447, a power supply 448, memory 449, a storage device 450, and a WLAN interface 452 and associated antenna 453. The vehicle control system 447 may be a powertrain control system, a body control system, an entertainment control system, an anti-lock braking system (ABS), a navigation system, a telematics system, a lane departure system, an adaptive cruise control system, etc.

The vehicle control system 447 may communicate with one or more sensors 454 and generate one or more output signals 456. The sensors 454 may include temperature sensors, acceleration sensors, pressure sensors, rotational sensors, airflow sensors, etc. The output signals 456 may control engine operating parameters, transmission operating parameters, suspension parameters, etc.

The power supply 448 provides power to the components of the vehicle 446. The vehicle control system 447 may store data in memory 449 and/or the storage device 450. Memory 449 may include random access memory (RAM) and/or nonvolatile memory such as flash memory, phase change memory, or multi-state memory, in which each memory cell has more than two states. The storage device 450 may include an optical storage drive, such as a DVD drive, and/or a hard disk drive (HDD). The vehicle control system 447 may communicate externally using the WLAN interface 452.

Figure 16F:
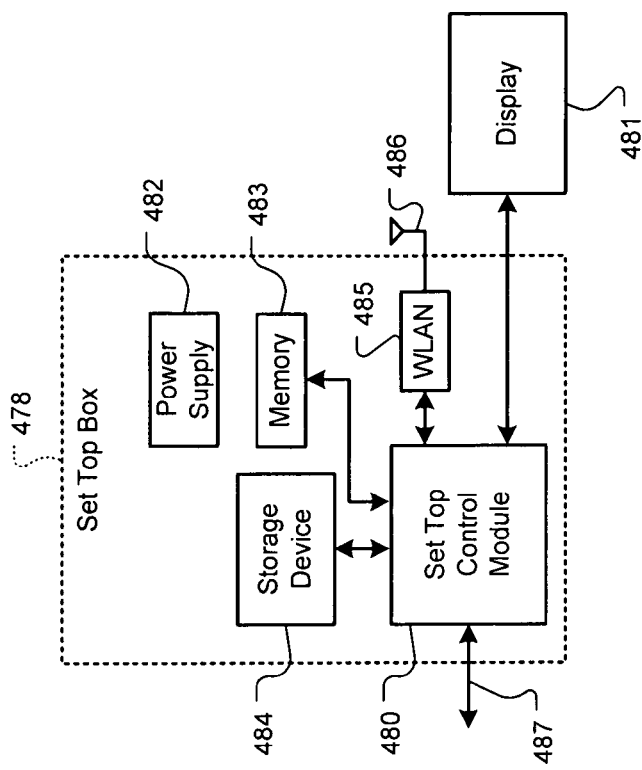
FIG. 16F is a functional block diagram of a set top box.
Figure 16E:
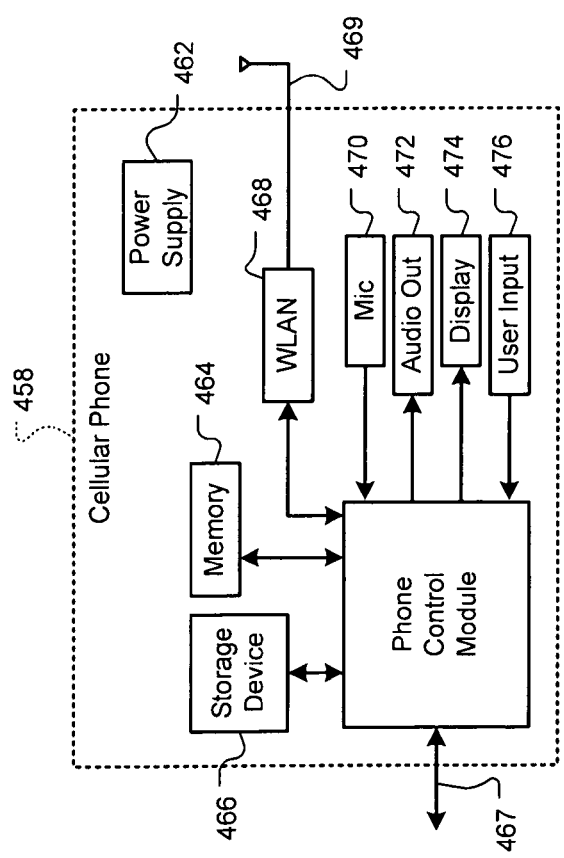
FIG. 16E is a functional block diagram of a cellular phone.

Referring now to FIG. 16E, the teachings of the disclosure can be implemented in a transistors of a cellular phone 458. The cellular phone 458 includes a phone control module 460, a power supply 462, memory 464, a storage device 466, and a cellular network interface 467. The cellular phone 458 may include a WLAN interface 468 and associated antenna 469, a microphone 470, an audio output 472 such as a speaker and/or output jack, a display 474, and a user input device 476 such as a keypad and/or pointing device.

The phone control module 460 may receive input signals from the cellular network interface 467, the WLAN interface 468, the microphone 470, and/or the user input device 476. The phone control module 460 may process signals, including encoding, decoding, filtering, and/or formatting, and generate output signals. The output signals may be communicated to one or more of memory 464, the storage device 466, the cellular network interface 467, the WLAN interface 468, and the audio output 472.

Memory 464 may include random access memory (RAM) and/or nonvolatile memory such as flash memory, phase change memory, or multi-state memory, in which each memory cell has more than two states. The storage device 466 may include an optical storage drive, such as a DVD drive, and/or a hard disk drive (HDD). The power supply 462 provides power to the components of the cellular phone 458.

Referring now to FIG. 16F, the teachings of the disclosure can be implemented in a transistors of a set top box 478. The set top box 478 includes a set top control module 480, a display 481, a power supply 482, memory 483, a storage device 484, and a WLAN interface 485 and associated antenna 486.

The set top control module 480 may receive input signals from the WLAN interface 485 and an external interface 487, which can send and receive information via cable, broadband Internet, and/or satellite. The set top control module 480 may process signals, including encoding, decoding, filtering, and/or formatting, and generate output signals. The output signals may include audio and/or video signals in standard and/or high definition formats. The output signals may be communicated to the WLAN interface 485 and/or to the display 481. The display 481 may include a television, a projector, and/or a monitor.

The power supply 482 provides power to the components of the set top box 478. Memory 483 may include random access memory (RAM) and/or nonvolatile memory such as flash memory, phase change memory, or multi-state memory, in which each memory cell has more than two states. The storage device 484 may include an optical storage drive, such as a DVD drive, and/or a hard disk drive (HDD).

Figure 16G:
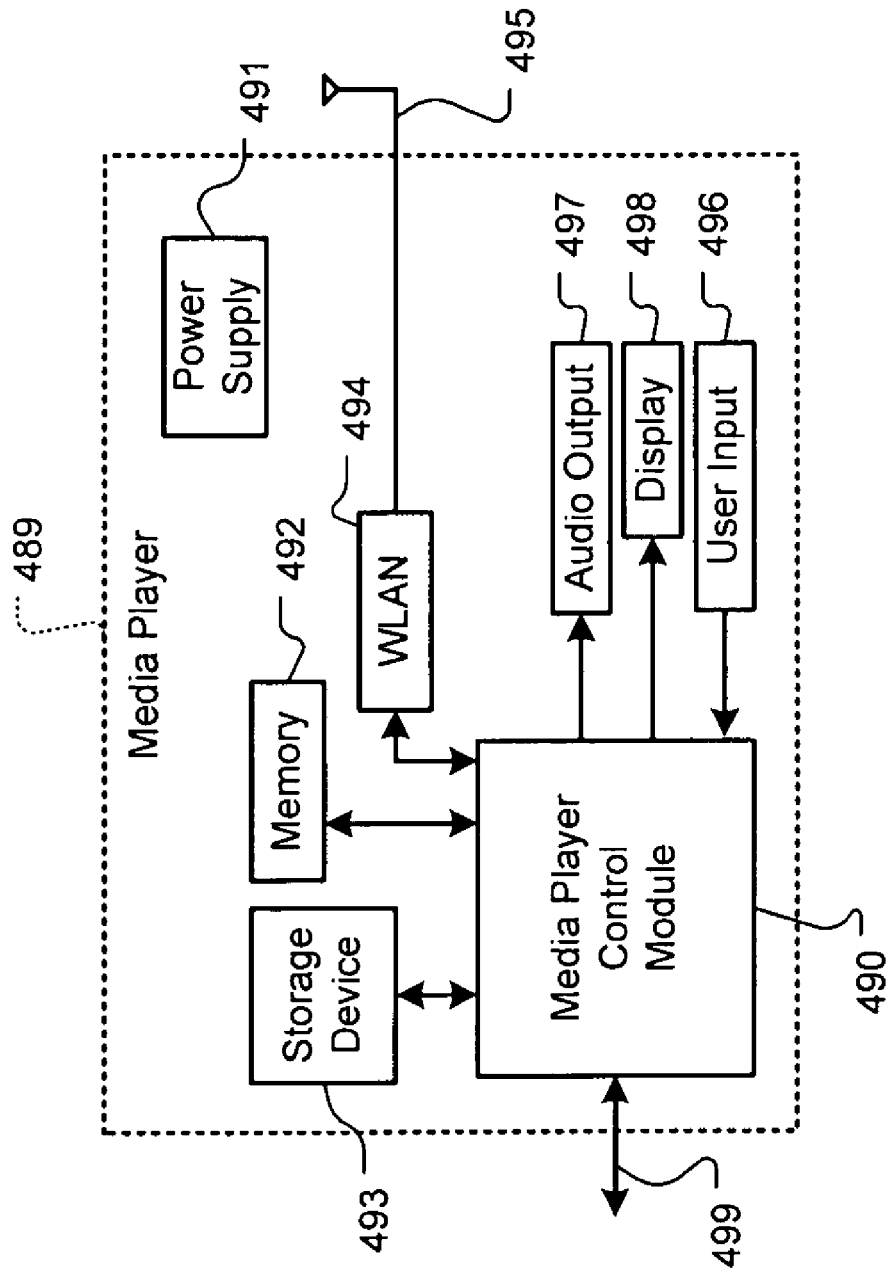
FIG. 16G is a functional block diagram of a media player.

Referring now to FIG. 16G, the teachings of the disclosure can be implemented in a transistors of a media player 489. The media player 489 may include a media player control module 490, a power supply 491, memory 492, a storage device 493, a WLAN interface 494 and associated antenna 495, and an external interface 499.

The media player control module 490 may receive input signals from the WLAN interface 494 and/or the external interface 499. The external interface 499 may include USB, infrared, and/or Ethernet. The input signals may include compressed audio and/or video, and may be compliant with the MP3 format. Additionally, the media player control module 490 may receive input from a user input 496 such as a keypad, touchpad, or individual buttons. The media player control module 490 may process input signals, including encoding, decoding, filtering, and/or formatting, and generate output signals.

The media player control module 490 may output audio signals to an audio output 497 and video signals to a display 498. The audio output 497 may include a speaker and/or an output jack. The display 498 may present a graphical user interface, which may include menus, icons, etc. The power supply 491 provides power to the components of the media player 489. Memory 492 may include random access memory (RAM) and/or nonvolatile memory such as flash memory, phase change memory, or multi-state memory, in which each memory cell has more than two states. The storage device 493 may include an optical storage drive, such as a DVD drive, and/or a hard disk drive (HDD).

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An integrated circuit, comprising:
   a first drain region having a symmetric shape across at least one of horizontal and vertical centerlines;
   a first gate region having a first shape surrounding said first drain region;
   a second drain region having said symmetric shape;
   a second gate region having said first shape surrounding said second drain region;
   a connecting gate region connecting said first and second gate regions;
   a first source region arranged adjacent to and on one side of said first gate region, said second gate region and said connecting gate region;
   a second source region arranged adjacent to and on another side of said first gate region, said second gate region and said connecting gate region opposite said one side; and first and second substrate contacts arranged in said first and second source regions, respectively.

2. The integrated circuit of claim 1, wherein said symmetric shape tapers as a distance from a center of said symmetric shape increases.

3. The integrated circuit of claim 1, wherein said integrated circuit includes laterally-diffused MOSFET transistors.

4. The integrated circuit of claim 1, wherein said symmetric shape is a circular shape.

5. The integrated circuit of claim 1, wherein said symmetric shape is an elliptical shape.

6. The integrated circuit of claim 1, wherein said symmetric shape is a polygonal shape.

7. The integrated circuit of claim 1, wherein said symmetric shape is a hexagonal shape.

8. The integrated circuit of claim 1, wherein the first and second substrate contacts are aligned with the connecting gate region in a first direction.

9. The integrated circuit of claim 1, further comprising third and fourth substrate contacts arranged in the first and second drain regions, respectively.

10. An integrated circuit, comprising:
 a first drain region including a first substrate contact;
 a first gate region surrounding the first drain region;
 a second drain region including a second substrate contact;
 a second gate region surrounding the second drain region;
 a connecting gate region connecting the first and second gate regions;
 a first source region arranged adjacent to and on a first side of the first gate region, the second gate region and the connecting gate region, the first source region including a third substrate contact; and
 a second source region arranged adjacent to and on a second side of the first gate region, the second gate region and the connecting gate region, the second side including a fourth substrate contact and being opposite the first side.

11. The integrated circuit of claim 10, wherein the first and second drain regions surround the first and second substrate contacts, respectively.

12. The integrated circuit of claim 10, wherein the first and second source regions surround the third and fourth substrate contacts, respectively.

13. The integrated circuit of claim 10, wherein the first, second, third, and fourth substrate contacts have one of a rectangle, circle, cross, and diamond shape.

14. The integrated circuit of claim 10, wherein an area of the first substrate contact is greater than 2 nm, wherein n is a total number of substrate contacts located in the first source region, and wherein m is an area of one of the substrate contacts located in the first source region.

15. The integrated circuit of claim 10, wherein the third and fourth substrate contacts are aligned with the connecting gate region in a first direction.

* * * * *